United States Patent
Huang et al.

(10) Patent No.: US 12,486,576 B2
(45) Date of Patent: Dec. 2, 2025

(54) SHADOW RING LIFT TO IMPROVE WAFER EDGE PERFORMANCE

(71) Applicant: Applied Materials, Inc., Santa Clara, CA (US)

(72) Inventors: Zubin Huang, Santa Clara, CA (US); Jallepally Ravi, San Ramon, CA (US); Kai Wu, Palo Alto, CA (US); Xiaoxiong Yuan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 355 days.

(21) Appl. No.: 17/473,118

(22) Filed: Sep. 13, 2021

(65) Prior Publication Data
US 2023/0002894 A1    Jan. 5, 2023

Related U.S. Application Data

(60) Provisional application No. 63/217,583, filed on Jul. 1, 2021.

(51) Int. Cl.
*C23C 16/458* (2006.01)
*C23C 16/06* (2006.01)
(Continued)

(52) U.S. Cl.
CPC .......... *C23C 16/4585* (2013.01); *C23C 16/06* (2013.01); *C23C 16/50* (2013.01);
(Continued)

(58) Field of Classification Search
CPC ........ H01L 21/68742; H01L 21/67242; H01L 21/6833
(Continued)

(56) References Cited

U.S. PATENT DOCUMENTS

| | | | |
|---|---|---|---|
| 5,922,133 A | | 7/1999 | Tepman et al. |
| 6,051,286 A | * | 4/2000 | Zhao .................. C23C 16/4401 |
| | | | 427/253 |

(Continued)

FOREIGN PATENT DOCUMENTS

| | | |
|---|---|---|
| CN | 111508805 A | 8/2020 |
| JP | 2010059542 A | 3/2010 |

(Continued)

OTHER PUBLICATIONS

International Search Report and Written Opinion dated Aug. 9, 2022 for Application No. PCT/US2022/025416.

(Continued)

*Primary Examiner* — Charlee J. C. Bennett
(74) *Attorney, Agent, or Firm* — Patterson + Sheridan, LLP

(57) ABSTRACT

A method and apparatus for processing a substrate are described herein. The methods and apparatus described enable the raising and lowering of a shadow ring within a process chamber either simultaneously with or separately from a plurality of substrate lift pins. The shadow ring is raised and lowered using a shadow ring lift assembly and may be raised to a pre-determined height above the substrate during a radical treatment operation. The shadow ring lift assembly may also raise and lower the plurality of substrate lift pins to enable both the shadow ring and the substrate lift pins to be raised to a transfer position when the substrate is being transferred into or out of the process chamber.

19 Claims, 13 Drawing Sheets

(51) Int. Cl.
*C23C 16/50* (2006.01)
*H01J 37/32* (2006.01)
*H01L 21/687* (2006.01)
*H01L 21/768* (2006.01)
*H01L 23/532* (2006.01)

(52) U.S. Cl.
CPC .. *H01J 37/32715* (2013.01); *H01L 21/68721* (2013.01); *H01L 21/68742* (2013.01); *H01L 21/76843* (2013.01); *H01L 21/76876* (2013.01); *H01L 21/76879* (2013.01); *H01L 23/53266* (2013.01); *H01J 2237/20235* (2013.01); *H01J 2237/332* (2013.01)

(58) Field of Classification Search
USPC .......................................................... 118/728
See application file for complete search history.

(56) References Cited

U.S. PATENT DOCUMENTS

| | | | | |
|---|---|---|---|---|
| 6,503,331 | B1* | 1/2003 | Yudovsky | H01J 37/3244 |
| | | | | 118/725 |
| 6,533,868 | B1* | 3/2003 | Green | C23C 14/564 |
| | | | | 118/728 |
| 8,365,682 | B2* | 2/2013 | Blonigan | H01L 21/68778 |
| | | | | 414/935 |
| 9,236,284 | B2 | 1/2016 | Ouye | |
| 2002/0046810 | A1* | 4/2002 | Tanaka | C23C 16/4401 |
| | | | | 156/345.51 |
| 2003/0000647 | A1 | 1/2003 | Yudovsky et al. | |
| 2004/0086640 | A1* | 5/2004 | Luo | H01L 21/31612 |
| | | | | 257/E21.279 |
| 2006/0260749 | A1 | 11/2006 | Ueda et al. | |
| 2010/0273334 | A1 | 10/2010 | Koelmel et al. | |
| 2011/0209660 | A1* | 9/2011 | Myo | C23C 16/4586 |
| | | | | 117/88 |
| 2011/0263123 | A1* | 10/2011 | Gomi | C23C 16/45521 |
| | | | | 438/681 |
| 2014/0041579 | A1* | 2/2014 | Jeong | B05C 13/00 |
| | | | | 118/500 |
| 2017/0365513 | A1 | 12/2017 | Yang et al. | |
| 2019/0035671 | A1* | 1/2019 | Ha | H01L 21/68757 |
| 2021/0040616 | A1 | 2/2021 | Park et al. | |
| 2022/0336182 | A1* | 10/2022 | Chowdhury | H01J 37/08 |
| 2024/0352588 | A1* | 10/2024 | Wang | C23C 16/45574 |

FOREIGN PATENT DOCUMENTS

| | | |
|---|---|---|
| JP | 2021064695 A | 4/2021 |
| KR | 20210043440 A | 4/2021 |
| WO | 0077548 A1 | 12/2000 |
| WO | 2019204754 A1 | 10/2019 |
| WO | 2021167958 A1 | 8/2021 |

OTHER PUBLICATIONS

Korean Office Action issued to Application No. 10-2024-7003483 on Dec. 18, 2024 in 11 pages.
Office Action issued to Japanese Application No. 2023-580780 on Feb. 27, 2025 in 4 pages.
Office Action for Japanese Application No. 2023-580780 dated Aug. 28, 2025.

* cited by examiner

SHADOW RING LIFT TO IMPROVE WAFER EDGE PERFORMANCE

CROSS-REFERENCE TO RELATED APPLICATIONS

This application claims priority to U.S. Provisional Patent Application No. 63/217,583, filed Jul. 1, 2021, the entirety of which is herein incorporated by reference.

BACKGROUND

Field

Embodiments herein are directed to systems and methods used in electronic device manufacturing, and more particularly, to systems and methods used for forming tungsten features in a semiconductor device.

Description of the Related Art

Tungsten (W) is widely used in integrated circuit (IC) device manufacturing to form conductive features where relatively low electrical resistance and relativity high resistance to electromigration are desired. For example, tungsten may be used as a metal fill material to form source contacts, drain contacts, metal gate fill, gate contacts, interconnects (e.g., horizontal features formed in a surface of a dielectric material layer), and vias (e.g., vertical features formed through a dielectric material layer to connect other interconnect features disposed there above and there below). Due to its relativity low resistivity, tungsten is also commonly used to form bit lines and word lines used to address individual memory cells in a memory cell array of a dynamic random-access memory (DRAM) device.

As circuit densities increase and device features continue to shrink to meet the demands of the next generation of semiconductor devices, reliably producing tungsten features has become increasingly challenging. Issues such as voids and seams formed during a conventional tungsten deposition process become amplified with decreasing feature size and can detrimentally affect the performance and reliability of a device or even render a device inoperable.

Shadow rings are utilized around the edge of a substrate during deposition of a chemical vapor deposition (CVD) tungsten (W) film in order to prevent deposition near the beveled edge of the substrate during seam suppressed tungsten film processes. However, the shadow ring has been shown to prevent effective treatment of the edges of the substrate during a nitrogen radical treatment operation performed subsequent to the CVD deposition. Preventing the effective treatment of the edges of the substrate causes a center to edge non-uniformity for the seam suppressed tungsten film due to a weak incubation delay near the edges of the substrate.

Accordingly, what is needed in the art are processing systems and methods that solve the problems described above.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of the description and are therefore not to be considered limiting of its scope, as the description may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

SUMMARY

Figure 1A:
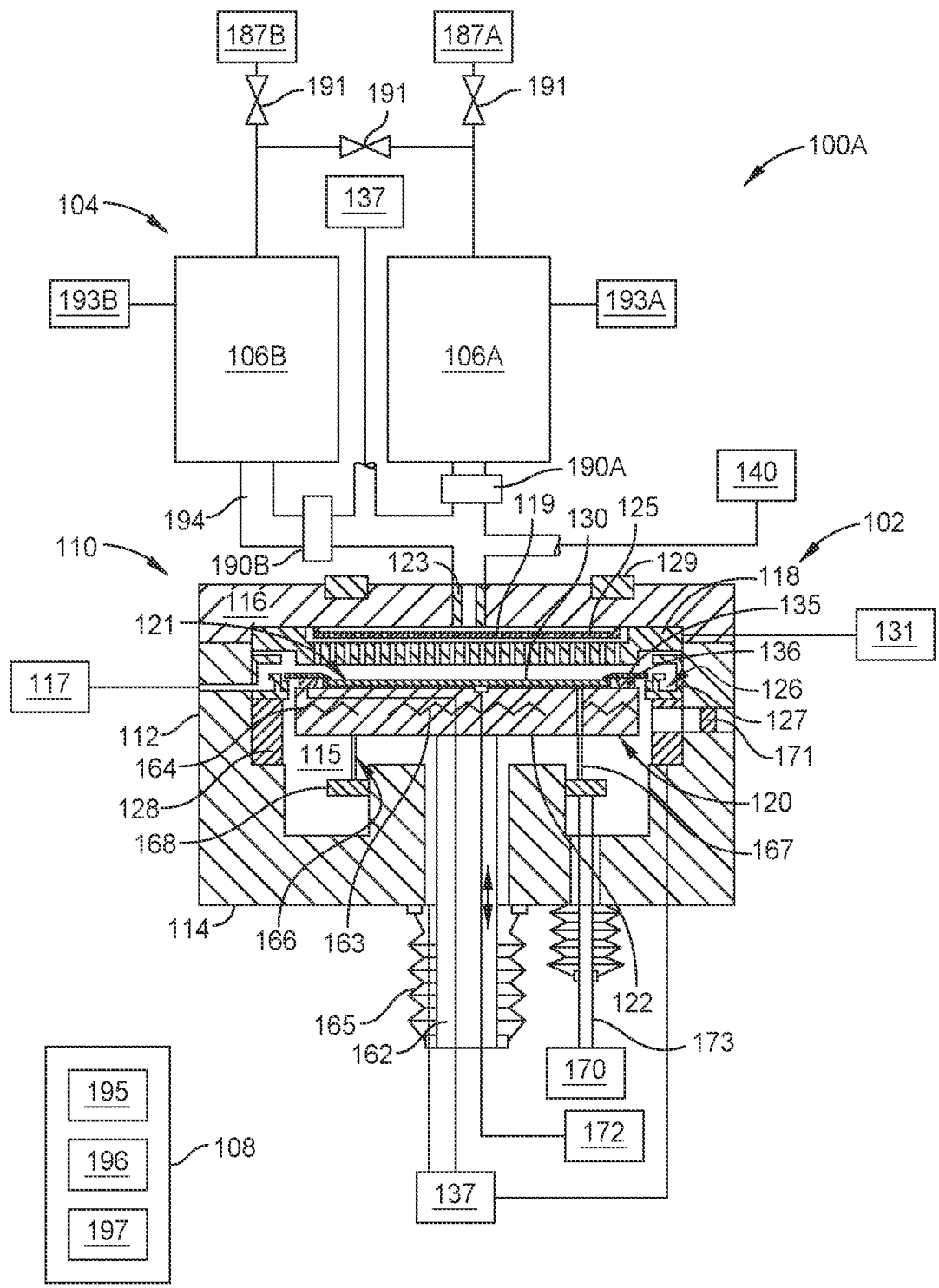
FIGS. 1A-1B schematically illustrate embodiments of processing systems that may be used to process a substrate, according to embodiments of the disclosure.

Embodiments of the present disclosure are generally directed towards a process chamber for substrate processing. The process chamber includes a chamber body, a substrate support disposed within the chamber body and having a top surface, a plurality of substrate lift pins disposed through the substrate support, and a shadow ring lift. The shadow ring lift is configured to raise and lower a shadow ring positioned around an edge of the top surface of the substrate support.

In another embodiment, another process chamber for substrate processing is described. The process chamber includes a chamber body, a substrate support disposed within the chamber body and having a top surface, a showerhead disposed within the chamber body and above the top surface of the substrate support, a plurality of substrate lift pins disposed through the substrate support, an annular liner disposed within the chamber body and circumscribing the substrate support, and a shadow ring spacer disposed on a portion of the annular liner. The shadow ring spacer is configured to hold a shadow ring positioned around an edge of the top surface of the substrate support at a first height from the showerhead.

In yet another embodiment, a method of processing a substrate is described. The method includes raising a shadow ring to a treatment position, wherein the shadow ring and a top surface of a substrate are separated by a treatment spacing, performing a nucleation process on the substrate within a process chamber, performing a differential inhibition process on the substrate within the process chamber, positioning the shadow ring and a plurality of substrate lift pins to a deposition position, and performing a deposition process on the substrate within the process chamber. The differential inhibition process is performed while the shadow ring is in the treatment position. While in the deposition position, the shadow ring and a top surface of the substrate are separated by a deposition spacing less than the treatment spacing.

In yet another embodiment, a method of processing a substrate is described where the method includes performing a nucleation process on the substrate, performing a differential inhibition process on the substrate within a first process chamber, transferring the substrate to a second process chamber, and, performing a deposition process on the substrate within the process chamber. During the differential inhibition process a distance between a bottom surface of a shadow ring and a top surface of the substrate is a treatment spacing. During the deposition process, a distance between a bottom surface of a second shadow ring and a top surface of the substrate is a deposition spacing less than the treatment spacing.

DETAILED DESCRIPTION

The present disclosure is directed towards apparatus and methods for moving a shadow ring within a substrate processing chamber. Moving the shadow ring enables the shadow ring to be positioned closer to a surface of a substrate during some process operations, but farther from the surface of the substrate during other process operations. In embodiments described herein, it is beneficial to have a shadow ring close to the surface of the substrate during deposition of a chemical vapor deposition (CVD) tungsten (W) film in order to prevent deposition near the beveled edge of the substrate during seam suppressed tungsten film processes. However, the close proximity of the shadow ring to the top surface of the substrate has been shown to prevent effective treatment of the edges of the substrate during a subsequent nitrogen radical treatment operation. The nitrogen radical treatment operation is performed subsequent to the CVD deposition and in the same process chamber. Preventing the effective treatment of the edges of the substrate causes a center to edge non-uniformity for the seam suppressed tungsten film due to a weak incubation delay near the edges of the substrate.

As discussed herein, it has been found that changing the relative position of the shadow ring with respect to the top surface of the substrate during the radical treatment operation compared to the deposition operation improves the uniformity of treatment of the substrate near the edge. Therefore, different apparatus and methods for changing the distance between the shadow ring and the top surface of the substrate are described herein. In embodiments described herein, the shadow ring may also be described as a non-contact shadow ring.

FIG. 1A schematically illustrates an embodiment of a processing system 100a that may be used to perform bottom-up tungsten gapfill substrate processing methods described herein. Here, the processing system 100a is configured to provide different processing conditions desired for each of a nucleation process, inhibition treatment process, selective gapfill process, and overburden deposition process within a single processing chamber 102, i.e., without transferring a substrate between a plurality of processing chambers.

The processing system 100a includes the processing chamber 102, a gas delivery system 104 fluidly coupled to the processing chamber 102, and a system controller 108. The processing chamber 102 includes a chamber lid assembly 110, one or more sidewalls 112, and a chamber base 114, which collectively define a processing volume 115. The processing volume 115 is fluidly coupled to an exhaust 117, such as one or more vacuum pumps, used to maintain the processing volume 115 at sub-atmospheric conditions and to evacuate processing gases and processing by-products therefrom.

The chamber lid assembly 110 includes a lid plate 116 and a showerhead 118 coupled to the lid plate 116 to define a gas distribution volume 119 therewith. Here, the lid plate 116 is maintained at a desired temperature using one or more heaters 129 thermally coupled thereto. The showerhead 118 faces a substrate support assembly 120 disposed in the processing volume 115. As discussed below, the substrate support assembly 120 is configured to move a substrate support 122, and thus a substrate 130 disposed on the substrate support 122, between a raised substrate processing position (as shown) and a lowered substrate transfer position (not shown). When the substrate support assembly 120 is in the raised substrate processing position, the showerhead 118 and the substrate support 122 define a processing region 121.

Here, the gas delivery system 104 is fluidly coupled to the processing chamber 102 through a gas inlet 123 that is disposed through the lid plate 116. Processing or cleaning gases delivered, by use of the gas delivery system 104, flow through the gas inlet 123 into the gas distribution volume 119 and are distributed into the processing region 121 through a plurality of openings in the showerhead 118. In some embodiments, the chamber lid assembly 110 further includes a perforated blocker plate 125 disposed between the gas inlet 123 and the showerhead 118. In those embodiments, gases flowed into the gas distribution volume 119 are first diffused by the blocker plate 125 to, together with the showerhead 118, provide a more uniform or desired distribution of gas flow into the processing region 121.

Here, processing gases and processing by-products are evacuated radially outward from the processing region 121 through an annular channel 126 that surrounds the processing region 121. The annular channel 126 may be formed in a first annular liner 127 disposed radially inward of the one or more sidewalls 112 (as shown) or may be formed in the one or more sidewalls 112. In some embodiments, the processing chamber 102 includes one or more second liners 128, which are used to protect the interior surfaces of the one or more sidewalls 112 or chamber base 114 from corrosive gases and/or undesired material deposition.

In some embodiments, a purge gas source 137 in fluid communication with the processing volume 115 is used to flow a chemically inert purge gas, such as argon (Ar), into a region disposed beneath the substrate support 122, e.g., through the opening in the chamber base 114 surrounding a support shaft 162 of the substrate support 122. The purge gas may be used to create a region of positive pressure below the substrate support 122 (when compared to the pressure in the processing region 121) during substrate processing. Typically, purge gas introduced through the chamber base 114 flows upwardly therefrom and around the edges of the substrate support 122 to be evacuated from the processing volume 115 through the annular channel 126. The purge gas reduces undesirable material deposition on surfaces beneath the substrate support 122 by reducing and/or preventing the flow of material precursor gases thereinto.

Here, the substrate support assembly 120 includes the movable support shaft 162 that sealingly extends through the chamber base 114, such as being surrounded by a bellows 165 in the region below the chamber base 114, and the substrate support 122, which is disposed on the movable support shaft 162. To facilitate substrate transfer to and from the substrate support 122, the substrate support assembly 120 includes a lift pin assembly 166 comprising a plurality of substrate lift pins 167 coupled to or disposed in engagement with a lift hoop 168. The plurality of substrate lift pins 167 are movably disposed in openings formed through the substrate support 122.

When the substrate support 122 is disposed in a lowered substrate transfer position (not shown), the plurality of substrate lift pins 167 extend above a substrate receiving surface of the substrate support 122 to lift a substrate 130 therefrom and provide access to a backside (non-active) surface of the substrate 130 by a substrate handler (not shown). When the substrate support 122 is in a raised or processing position (as shown), the plurality of substrate lift pins 167 recede beneath the substrate receiving surface of the substrate support 122 to allow the substrate 130 to rest thereon.

The plurality of substrate lift pins 167 are raised and lowered by a lift pin actuator 170. The lift pin actuator 170 may be a motor or other actuator, such as a stepping motor, a servo motor, or a direct drive motor. In some embodiments, the lift pin actuator 170 is electrically coupled to a system controller, such as the system controller 108. The lift pin actuator 170 may be coupled to the lift pin assembly via one or more pin lift shafts 173. The pin lift shafts 173 may be coupled to the lift hoop 168. In embodiments described herein, the lift hoop 168 may be a plate or disk which is supported by the one or more pin lift shafts 173 and is configured to support at least the lift pin assembly 166.

Here, the substrate 130 is transferred to and from the substrate support 122 through a door 171, e.g., a slit valve disposed in one of the one or more sidewalls 112. Here, one or more openings in a region surrounding the door 171, e.g., openings in a door housing, are fluidly coupled to a purge gas source 137, e.g., an Ar gas source. The purge gas is used to prevent processing and cleaning gases from contacting and/or degrading a seal surrounding the door, thus extending the useful lifetime thereof.

Here, the substrate support 122 is configured for vacuum chucking where the substrate 130 is secured to the substrate support 122 by applying a vacuum to an interface between the substrate 130 and the substrate receiving surface. The vacuum is applied use of a vacuum source 172 fluidly coupled to one or more channels or ports formed in the substrate receiving surface of the substrate support 122. In other embodiments, e.g., where the processing chamber 102 is configured for direct plasma processing, the substrate support 122 may be configured for electrostatic chucking. In some embodiments, the substrate support 122 includes one or more electrodes (not shown) coupled to a bias voltage power supply (not shown), such as a continuous wave (CW) RF power supply or a pulsed RF power supply, which supplies a bias voltage thereto.

As shown, the substrate support assembly 120 features a dual-zone temperature control system to provide independent temperature control within different regions of the substrate support 122. The different temperature-controlled regions of the substrate support 122 correspond to different regions of the substrate 130 disposed of thereon. Here, the temperature control system includes a first heater 163 and a second heater 164. The first heater 163 is disposed in a central region of the substrate support 122, and the second heater 164 is disposed radially outward from the central region to surround the first heater 163. In other embodiments, the substrate support 122 may have a single heater or more than two heaters.

The substrate support assembly 120 further includes an annular shadow ring 135, which is used to prevent undesired material deposition on a circumferential bevel edge of the substrate 130. During substrate transfer to and from the substrate support 122, i.e., when the substrate support assembly 120 is disposed in a lowered position (not shown), the shadow ring 135 rests on an annular ledge within the processing volume 115. When the substrate support assembly 120 is disposed in a raised or processing position, the radially outward surface of the substrate support 122 engages with the annular shadow ring 135 so that the shadow ring 135 circumscribes the substrate 130 disposed on the substrate support 122. Here, the shadow ring 135 is shaped so that a radially inward facing portion of the shadow ring 135 is disposed above the bevel edge of the substrate 130 when the substrate support assembly 120 is in the raised substrate processing position.

In some embodiments, the substrate support assembly 120 further includes an annular purge ring 136 disposed on the substrate support 122 to circumscribe the substrate 130. In those embodiments, the shadow ring 135 may be disposed on the purge ring 136 when the substrate support assembly 120 is in the raised substrate processing position. Typically, the purge ring 136 features a plurality of radially inward facing openings that are in fluid communication with the purge gas source 137. During substrate processing, a purge gas flows into an annular region defined by the shadow ring 135, the purge ring 136, the substrate support 122, and the bevel edge of the substrate 130 to prevent processing gases from entering the annular region and causing undesired material deposition on the bevel edge of the substrate 130.

In some embodiments, the processing chamber 102 is configured for direct plasma processing. In those embodiments, the showerhead 118 may be electrically coupled to a first power supply 131, such as an RF power supply, which supplies power to ignite and maintain a plasma of processing gases flowed into the processing region 121 through capacitive coupling therewith. In some embodiments, the processing chamber 102 comprises an inductive plasma generator (not shown), and a plasma is formed through inductively coupling an RF power to the processing gas.

Here, the processing system 100a may be configured to perform each of the tungsten nucleation, inhibition treatment, and bulk tungsten deposition processes of a void-free and seam-free tungsten gapfill process scheme without removing the substrate 130 from the processing chamber 102. The gases used to perform the individual processes of the gapfill process scheme, and to clean residues from the interior surfaces of the processing chamber, are delivered to the processing chamber 102 using the gas delivery system 104 fluidly coupled thereto.

Generally, the gas delivery system 104 includes one or more remote plasma sources, here a first and second radical generator 106A-B, a deposition gas source 140, and a conduit system 194 fluidly coupling the radical generators 106A-B and the deposition gas source 140 to the lid assembly 110. The gas delivery system 104 further includes a plurality of isolation valves, here a first and second valves 190A-B, respectively disposed between the radical generators 106A-B and the lid plate 116, which may be used to fluidly isolate each of the radical generators 106A-B from the processing chamber 102 and from one another.

Each of the radical generators 106A-B is coupled to a respective power supply 193A-B. The power supplies 193A-B are used to ignite and maintain a plasma of gases delivered to the plasma chamber volumes within the radical generators 106A-B from a corresponding first or second gas source 187A-B fluidly coupled thereto. In some embodiments, the first radical generator 106A generates radicals used in a differential inhibition process. For example, the first radical generator 106A may be used to ignite and maintain a treatment plasma from a non-halogen-containing gas mixture delivered to the first plasma chamber volume from the first gas source 187A. The second radical generator 106B may be used to generate cleaning radicals used in a chamber clean process by igniting and maintaining a cleaning plasma from a halogen-containing gas mixture delivered to the second plasma chamber volume from the second gas source 187B.

In some embodiments, the first radical generator 106A is also fluidly coupled to the second gas source 187B, which delivers a halogen-containing conditioning gas to the first plasma chamber volume to be used in a plasma source condition process. In those embodiments, the gas delivery system 104 may further include a plurality of diverter valves 191, which are operable to direct the halogen-containing gas mixture from the second gas source 187B to the first plasma chamber volume of the radical generator 106A.

Suitable remote plasma sources which may be used for one or both of the radical generators 106A-B include radio frequency (RF) or very high radio frequency (VHRF) capacitively coupled plasma (CCP) sources, inductively coupled plasma (ICP) sources, microwave-induced (MW) plasma sources, electron cyclotron resonance (ECR) chambers, or high-density plasma (HDP) chambers.

Operation of the processing system 100a is facilitated by the system controller 108. The system controller 108 includes a programmable central processing unit, here the CPU 195, which is operable with a memory 196 (e.g., non-volatile memory) and support circuits 197. The CPU 195 is one of any form of general-purpose computer processor used in an industrial setting, such as a programmable logic controller (PLC), for controlling various chamber components and sub-processors. The memory 196, coupled to the CPU 195, facilitates the operation of the processing chamber. The support circuits 197 are conventionally coupled to the CPU 195 and comprise cache, clock circuits, input/output subsystems, power supplies, and the like, and combinations thereof coupled to the various components of the processing system 100 to facilitate control of substrate processing operations therewith.

Here, the instructions in memory 196 are in the form of a program product, such as a program that implements the methods of the present disclosure. In one example, the disclosure may be implemented as a program product stored on computer-readable storage media for use with a computer system. The program(s) of the program product define functions of the embodiments (including the methods described herein). Thus, the computer-readable storage media, when carrying computer-readable instructions that direct the functions of the methods described herein, are embodiments of the present disclosure.

Advantageously, the processing system 100 described above may be used to perform each of a nucleation, an inhibition, a gapfill deposition, and an overburden deposition process, thus providing a single-chamber seam-free tungsten gapfill solution.

Figure 1B:
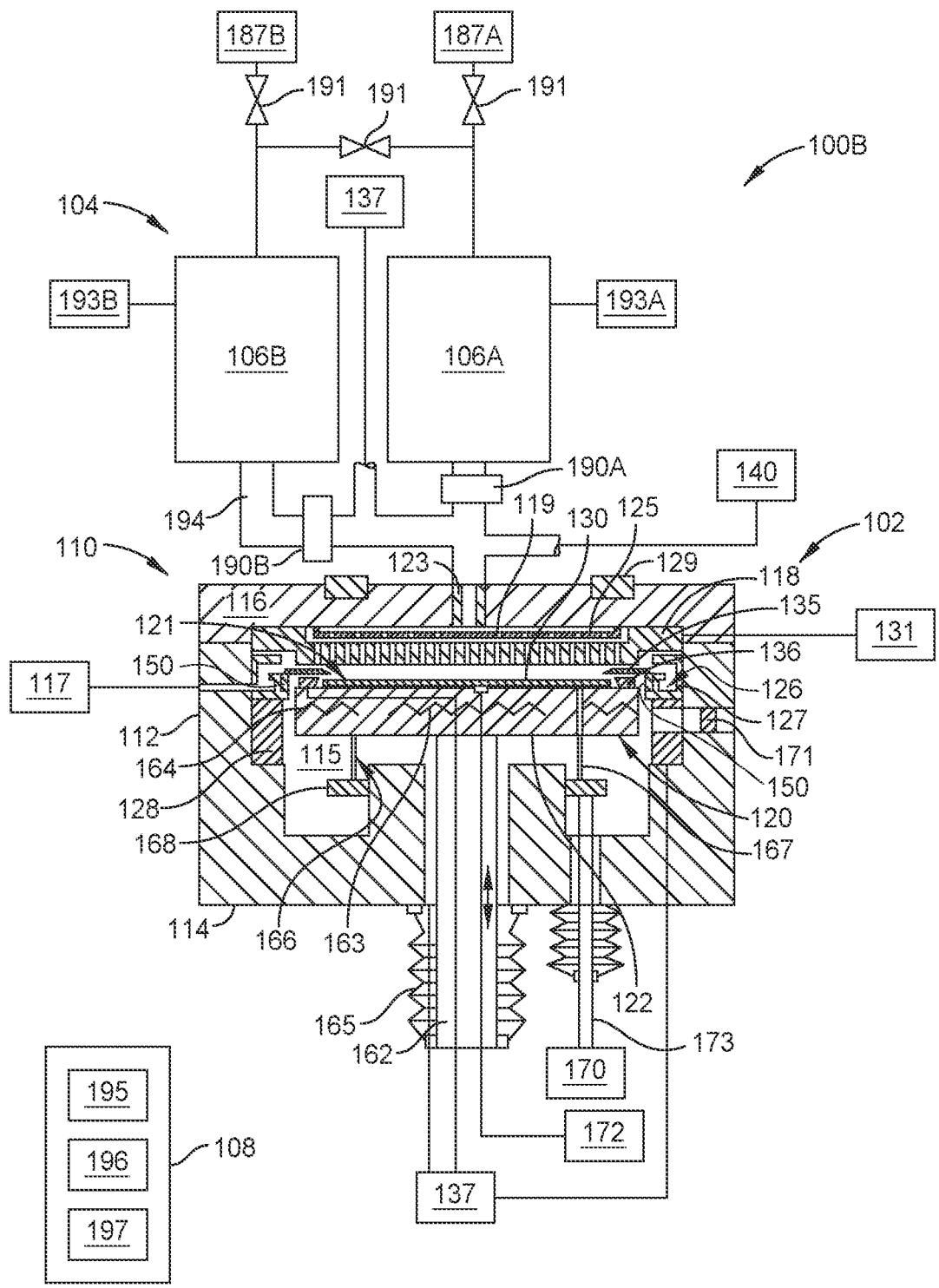

FIG. 1B schematically illustrates another embodiment of a processing system 100b that may be used to perform bottom-up tungsten gapfill substrate processing methods described herein. Here, the processing system 100b is similar to the processing system 100a, but further includes a shadow ring spacer 150 disposed over a portion of the first annular liner 127. The shadow ring spacer 150 is radially inward of the annular channel 126. The shadow ring spacer 150 is configured to separate the shadow ring 135 from the top surface of the substrate 130. Separating the shadow ring spacer 150 from the top surface of the substrate 130 allows radicals generated during a differential inhibition process/radial treatment operation to more evenly treat the surface of the substrate near the beveled edge of the substrate compared to the central portion. The shadow ring spacer 150 is further described with respect to FIGS. 2A-2B.

In some embodiments, a substrate, such as the substrate 130, is transferred between the first processing system 100a of FIG. 1A and the second processing system 100b of FIG. 1B. The first processing system 100a is utilized during deposition of a chemical vapor deposition (CVD) tungsten (W) film. The first processing system 100a is beneficial in that the shadow ring 135 is disposed adjacent to the top surface of the substrate 130 and therefore deposition near the beveled edge of the substrate is prevented during seam suppressed tungsten film processes. However, the close proximity of the shadow ring to the top surface of the substrate has been shown to prevent effective treatment of the edges of the substrate during a subsequent nitrogen radical treatment operation, such as a differential inhibition process of activities 805, 853 (FIGS. 8A-8D). Therefore, the substrate 130 is moved to a second processing system, such as the second processing system 100b of FIG. 1B before performing the nitrogen radical treatment operation.

Figure 2A:
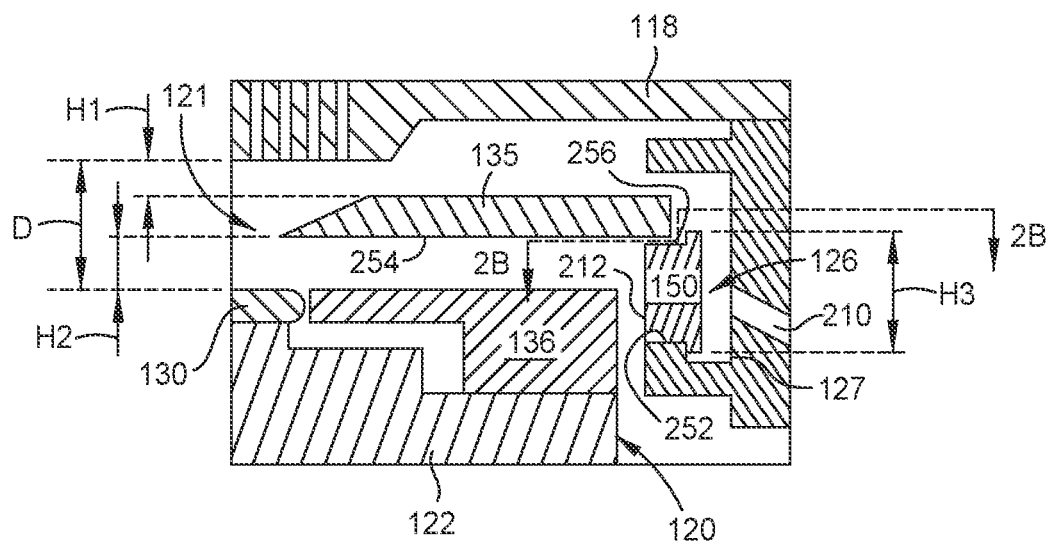
FIG. 2A illustrates a schematic close-up cross sectional view of a shadow ring spacer of FIG. 1B, according to embodiments of the disclosure.

FIG. 2A illustrates a schematic close-up cross sectional view of a portion of the processing system 100b of FIG. 1B which includes the shadow ring spacer 150. The shadow ring spacer 150 is disposed on top of a ledge 252 of the first annular liner 127. A top spacer surface 256 contacts a bottom shadow ring surface 254 of the shadow ring 135 to hold the shadow ring 135 at a raised position over the edge of the substrate 130. In embodiments described herein, the shadow ring spacer 150 separates the substrate 130 and the shadow ring 135 to enable improved radical treatment of the top surface of the substrate 130. However, the distance between the bottom surface of the showerhead 118 and the top surface of the substrate 130 remains the same during both a nucleation process and a differential inhibition process.

In some embodiments, the distance D between the bottom surface of the showerhead 118 and the top surface of the substrate 130 is less than about 25 mm, such as less than about 20 mm, such as less than about 15 mm, such as about 5 mm to about 15 mm. The top surface of the shadow ring 135 is separated from the bottom surface of the showerhead 118 by a first height H1. The first height H1 is about 1.5 mm to about 4 mm, such as about 2 mm to about 3 mm, such as about 2.5 mm to about 2.75 mm, such as about 2.54 mm. The bottom shadow ring surface 254 is disposed a second height H2 from the top surface of the substrate 130. The second height H2 is less than about 12 mm, such as about 2 mm to about 11 mm, such as about 2 mm to about 10 mm. The second height H2 controls the deposition and treatment operations near the edge of the substrate 130. When the shadow ring 135 is disposed the second height H2 above the substrate 130, the treatment operations described herein may be performed to more uniformly treat the edges of the substrate 130. The shadow ring spacer 150 has a height H3.

The height H3 of the shadow ring spacer 150 may vary depending on the structure of the first annular liner 127 and the processing chamber 102. In some embodiments, the height H3 is about 9 mm to about 15 mm, such as about 10 mm to about 14 mm, such as about 11 mm to about 13 mm, such as about 12 mm to about 13 mm, such as about 12.7 mm.

For the first processing system 100a without the shadow ring spacer 150, the vertical spacing (similar to H2 of FIG. 2A) between the shadow ring 135 and the substrate 130 is less than about 2 mm, such as less than about 1.5 mm, such as less than about 1 mm. The shadow ring spacer 150 is disposed radially inward of one of more exhaust passages 210, which are fluidly coupled to the exhaust 117. The one or more exhaust passages 210 are disposed around the circumference of the processing region 121. The annular channel 126 may be disposed between the one or more exhaust passages 210 and the shadow ring spacer 150. In some embodiments, there are a plurality of shadow ring spacers 150 disposed around the circumference of the first annular liner 127. The inner surface 212 of the shadow ring spacer 150 is disposed radially outward of the annular purge ring 136 and the substrate support assembly 120.

Figure 2B:
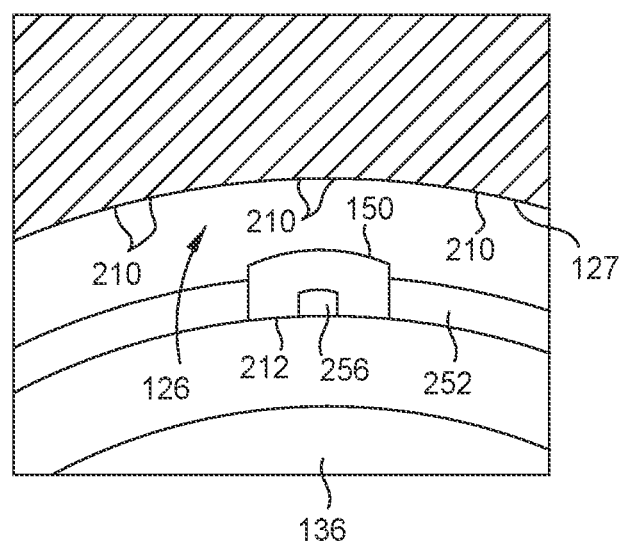
FIG. 2B illustrates a partial top view of a portion of the shadow ring spacer of FIG. 1B, according to embodiments of the disclosure.

FIG. 2B illustrates a partial top view of a portion of the processing system of FIG. 1B, according to embodiments of the disclosure. FIG. 2B illustrates the shadow ring spacer 150 without the shadow ring 135 disposed thereon for clarity. As shown in FIG. 2B, the shadow ring spacer 150 is a discreet spacer disposed along a portion of a ledge 252 of the first annular liner 127. In embodiments described herein, there may be a plurality of shadow ring spacers 150 disposed radially around the circumference of the ledge 252, such as three or more shadow ring spacers 150 evenly spaced along the ledge 252. The top spacer surface 256 is disposed along a portion of the top of the shadow ring spacer 150 and may be a groove formed in the shadow ring spacer 150. The height H3 of the shadow ring spacer 150 may vary depending on the structure of the first annular liner 127 and the processing chamber 102. In some embodiments, the height H3 is about 9 mm to about 15 mm, such as about 10 mm to about 14 mm.

Figure 3:
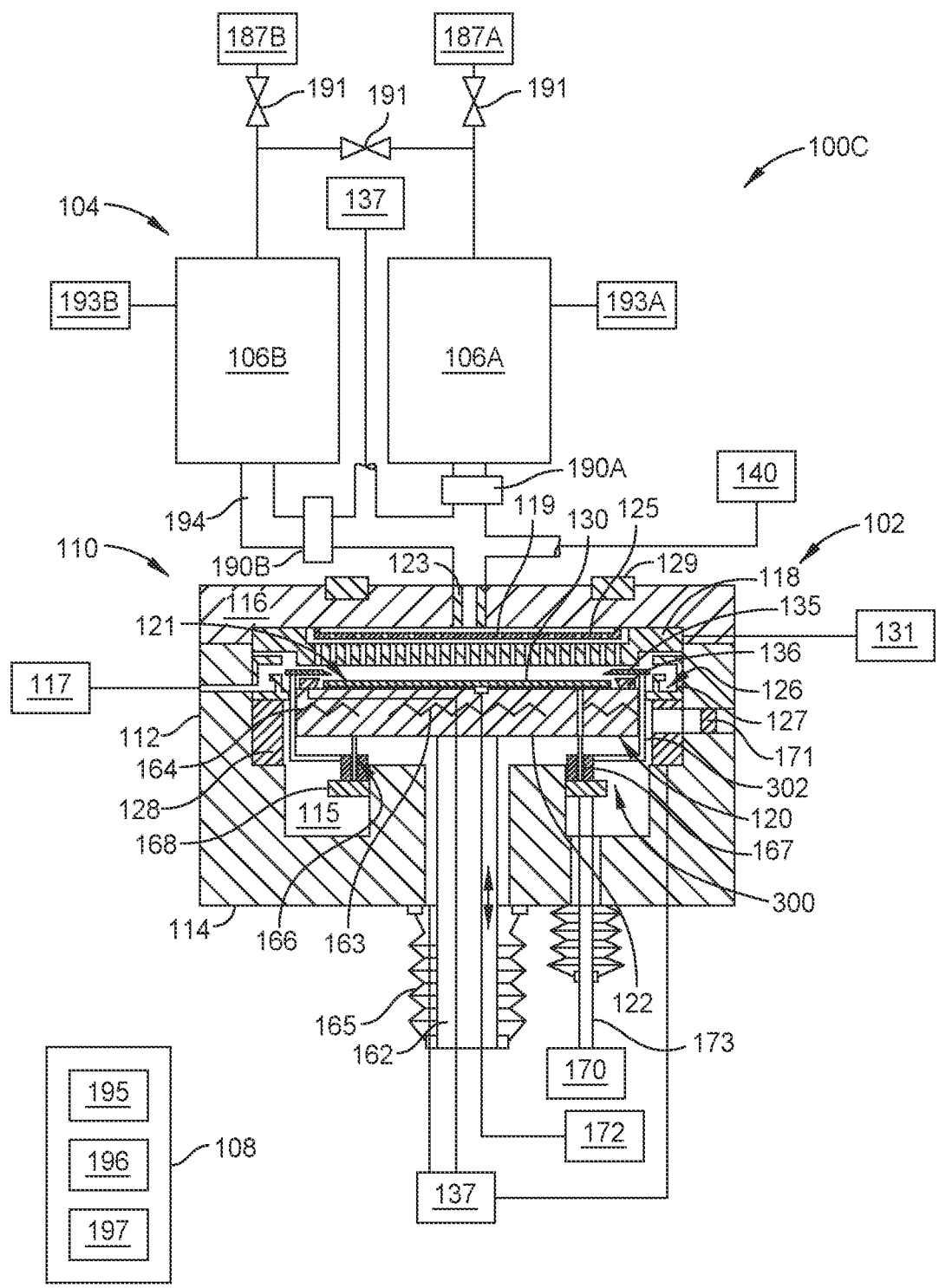
FIG. 3 schematically illustrates another embodiment of a processing system that may be used to process the substrate, according to embodiments of the disclosure.

FIG. 3 schematically illustrates another embodiment of a processing system 100c that may be used to process the substrate 130. The processing system 100c of FIG. 3 is similar to the processing systems 100a, 100b of FIGS. 1B, but instead of the shadow ring spacers 150, the processing system 100c includes a shadow ring lift assembly 300. The shadow ring lift assembly 300 is integrated with the lift pin assembly 166, such that the lift hoop 168 may be detachably coupled to both the plurality of substrate lift pins 167 as well as a plurality of shadow ring lift pins 302. The shadow ring lift assembly 300 is configured to raise and lower the shadow ring 135 between or during processing operations. Both the shadow ring 135 and the substrate lift pins 167 may be raised or lowered either simultaneously or separately as described herein.

Figure 4A:
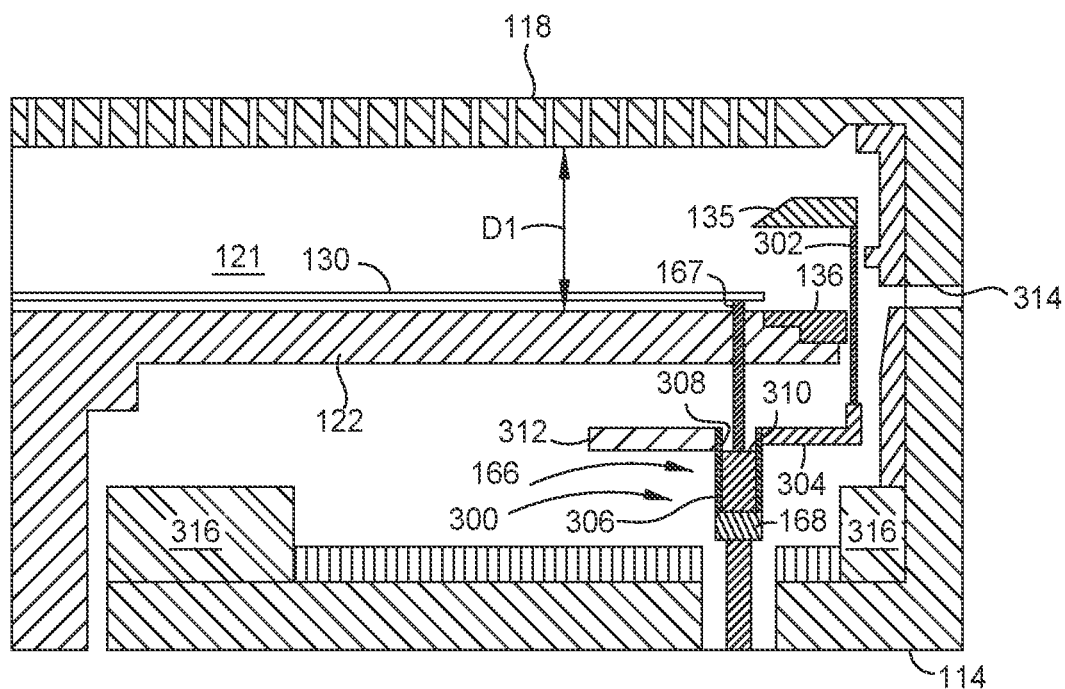
FIGS. 4A-4C illustrate schematic close-up cross sectional views of a shadow ring lift assembly of FIG. 3 at different processing positions, according to embodiments of the disclosure.
Figure 4B:
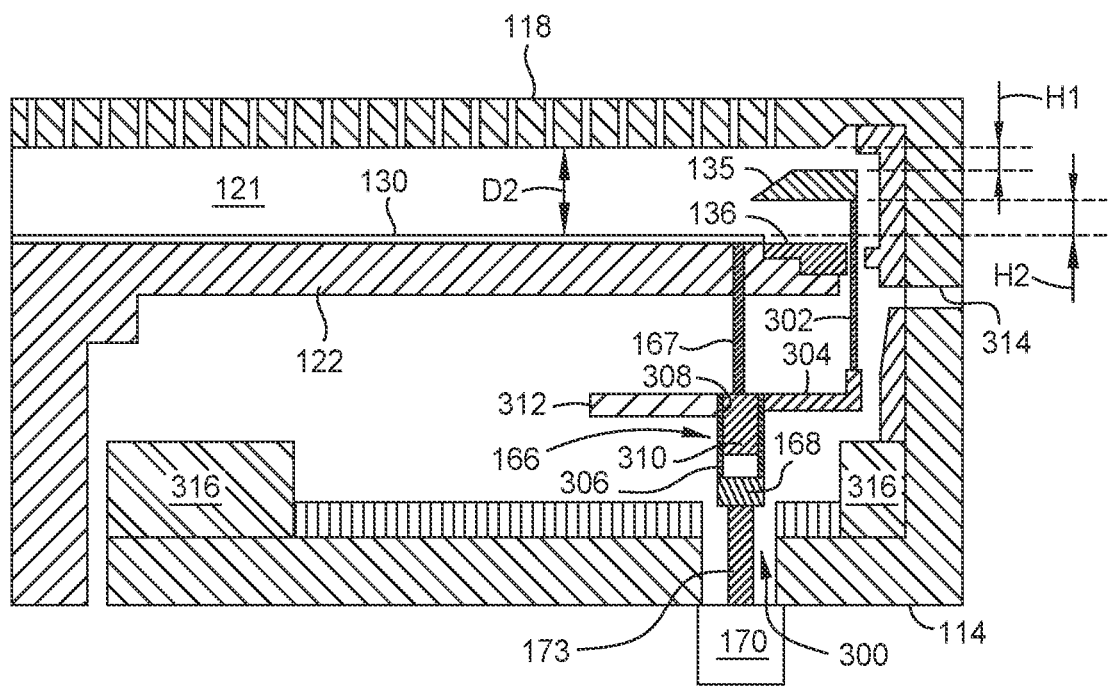
Figure 4C:
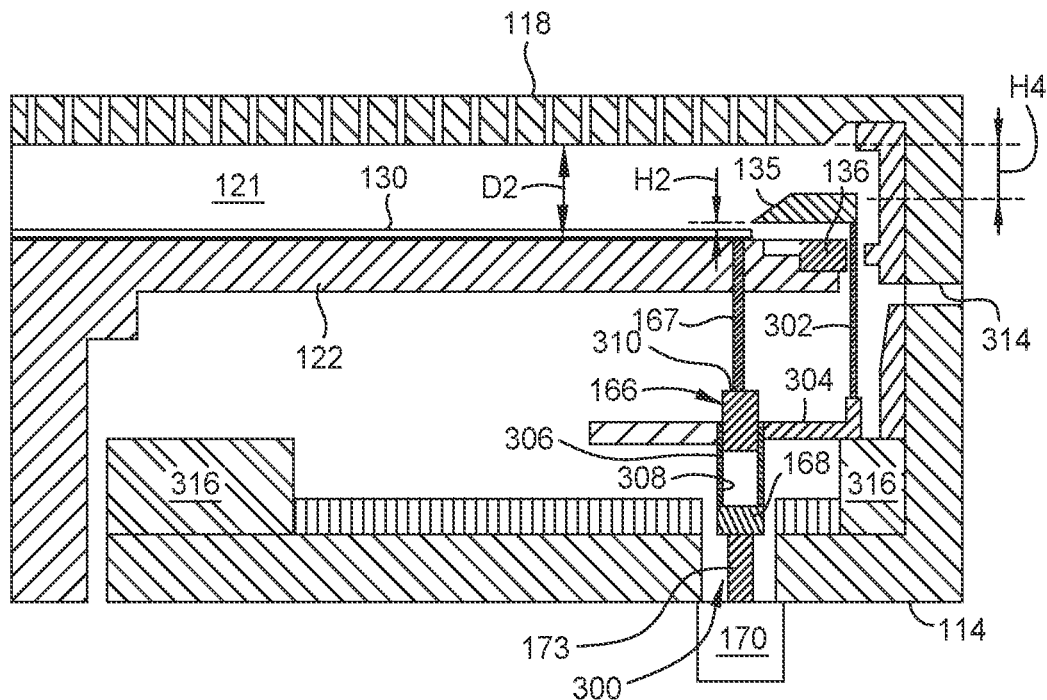

FIGS. 4A-4C illustrate schematic close-up cross sectional views of a portion of the processing system 100c of FIG. 3 while the lift pin assembly 166 is disposed at different positions. As shown in FIGS. 4A-4C, the shadow ring lift assembly 300 includes the lift hoop 168, the lift pin assembly 166, the shadow ring lift pins 302, a shadow ring lift plate 312, one or more shadow ring lift arms 304 extending from the shadow ring lift plate 312, and a plurality of lift pin housings 306 extending through the shadow ring lift plate 312. The plurality of lift pin housings 306 are openings through the shadow ring lift plate 312 and include sidewalls extending downward from the shadow ring lift plate 312 to provide a guide for the substrate lift pins 167.

The bottom surface of each of the lift pin housings 306 is coupled to and disposed on top of the lift hoop 168. In some embodiments, the lift pin housings 306 are disposed through the lift hoop 168 and form openings through the lift hoop 168. In some embodiments, the lift pin housings 306 are disposed both partially above and partially below the lift hoop 168, such that the lift pin housings 306 are shafts disposed through the lift hoop 168. The lift pin housing 306 may be mechanically coupled to each of the shadow ring lift arms 304. The shadow ring lift arms 304 extend outwardly from the shadow ring lift plate 312 and couple the shadow ring lift pins 302 to the shadow ring lift plate 312 and the lift pin housings 306 and subsequently enables motion of the shadow ring lift pins 302 when the lift hoop 168 moves in an upward and a downward motion.

The lift hoop 168 may be coupled to one or more pin lift shafts 173 and the lift pin actuator 170 to enable vertical motion of the lift hoop 168. The lift hoop 168 may then impart motion onto one or both of the lift pin assembly 166 or the shadow ring lift assembly 300. The lift pin actuator 170 may be a motor or a pneumatic actuator. The controller 108 (FIG. 3) may control the lift pin actuator 170 to position the lift hoop 168, the substrate lift pins 167, the shadow ring lift pins 302, and the lift pin housing 306 as described with respect to FIGS. 4A-4C. In some embodiments, the shadow ring lift plate 312 is coupled to and disposed on the lift hoop 168 and the bottom surface of each of the lift pin housings 306 does not contact the lift hoop 168.

The lift pin assembly 166 includes a lift pin base 310 coupled to each lift pin 167. The lift pin 167 is configured to extend through a portion of the substrate support 122 to contact a backside of the substrate 130. The lift pin 167 is configured to rest in a slot disposed within the substrate support 122. The bottom distal end of the lift pin 167 is coupled to the lift pin base 310. The lift pin base 310 may be a cylindrical base and is configured to have a substantially similar diameter to a hollow inner surface 308 of each of the lift pin housings 306. Each of the lift pin housings 306 have the hollow inner surface 308 to enable the lift pin base 310 to move therein. In some embodiments, the lift pin housings 306 surround the entire circumference of the lift pin base 310. In other embodiments, the lift pin housings 306 partially surround the circumference of the lift pin base 310.

As shown in FIG. 4A, the substrate support 122, the shadow ring lift assembly 300, and the lift pin assembly 166 are in a substrate transfer position, such that the substrate 130 is lifted off of the substrate support 122 and the shadow ring 135 is in a transfer position. The substrate transfer position enables the substrate 130 to be transferred into and out of the processing system 100c using a transfer robot (not shown). The substrate 130 is level with an opening 314 disposed through the side of the processing chamber 102. As described with respect to FIGS. 1A, 1B, and 3, the opening 314 may include a slit valve or a door disposed therein. Although not apparent from FIG. 4A, it should be noted that the shadow ring lift pins 302 are offset from the opening 314 to allow movement of the substrate 130 into and out of the processing chamber 102.

While in the substrate transfer position, the lift hoop 168 is in contact with the lift pin base 310 as well as the lift pin housing 306. The lift hoop 168 is a ring which connects to the one or more lift pin shafts 173 and is used as a base for lifting the substrate as well as the shadow ring 135. While in the substrate transfer position, the first distance $D_1$ between the bottom surface of the showerhead 118 and the top surface of the substrate support 122 is about 40 mm to about 80 mm, such as about 50 mm to about 70 mm, such as about 55 mm to about 65 mm. While in the transfer position, the shadow ring 135 and the shadow ring lift pins 302 may be in a variety of positions above the substrate support 122 and the substrate 130. As described herein, the height of the shadow ring 135 is at least partially dependent upon the position of the substrate lift pins 167 during transfer of the substrate 130 into and out of the processing region 121.

While in the substrate transfer position, the shadow ring lift pins 302 contact a bottom surface of the shadow ring 135. Each of the shadow ring lift pins 302 are disposed radially outward of the substrate 130 and disposed at obtuse angles around the circumference of the substrate support 122 to enable the substrate 130 to pass therebetween and into the opening 314 during substrate transfer.

As shown in FIG. 4B, the shadow ring lift assembly 300 and the lift pin assembly 166 are in a treatment position. While in the treatment position, the lift hoop 168 is in a position where the shadow ring 135 is above the substrate 130, while the substrate lift pins 167 are in a lowered position. The lowered position of the substrate lift pins 167 is a position wherein the tops of the substrate lift pins 167 are parallel with or disposed below a substrate support surface and the substrate 130. The substrate support 122 is disposed in a raised position while in the treatment position, such that a substrate support surface of the substrate support 122 is disposed a second distance $D_2$ from the bottom surface of the showerhead 118. The second distance $D_2$ is less than about 25 mm, such as less than about 20 mm, such as less than about 15 mm, such as about 10 mm to about 15 mm.

The top surface of the shadow ring 135 is separated from the bottom surface of the showerhead 118 by a first height H1. The first height H1 is less than about 11 mm, such as about 1 mm about 10 mm. The bottom shadow ring surface 154 is disposed a second height H2 from the top surface of one or both of the purge ring 136 and the substrate 130. The second height H2 may vary between about 1 mm to about 11 mm, such as about 1 mm to about 10 mm, such as about 5 mm to about 8 mm. During treatment operations where the shadow ring 135 is raised (as shown in FIG. 4B), the second height H2 is about 5 mm to about 11 mm, such as about 6 mm to about 10 mm, such as about 6 mm to about 8 mm, such as about 6.35 mm.

While in the treatment position, the substrate lift pins 167 are in a free-hanging state from the substrate support 122, such that the lift pin bases 310 do not contact the top surface of the lift hoop 168, but are still disposed within the hollow inner surface 308 of the lift pin housings 306. A gap may be disposed between the lift pin bases 310 and the lift hoop 168, such that the substrate lift pins 167 are at least partially disposed within the lift pin housings 306, but are not mechanically supported by the lift hoop 168. The shadow ring lift plate 312 and/or one or more of the lift pin housings 306 are in contact with the lift hoop 168 while in the treatment position, such that the shadow ring lift plate 312 and the shadow ring lift pins 302 are in a raised position. While in the raised position, the shadow ring lift plate 312 and the one or more shadow ring lift arms 304 are separated from the lower wall 316 of the chamber base 114.

As shown in FIG. 4C, both the shadow ring 135 and the substrate lift pins 167 are shown in a deposition position, such that the shadow ring 135 is configured to protect the substrate 130 during a deposition process. The shadow ring 135 is in a lower position than in the treatment position of FIG. 4B, such that the lift hoop 168 and the lift pin housing 306 are lowered. The substrate lift pins 167 are similarly free-hanging from the substrate support 122 as in the treatment position of FIG. 4B. The substrate lift pins 167 do not move while the shadow ring 135 is lowered from the treatment position to the deposition position or while the shadow ring 135 is raised from the deposition position to the treatment position.

While in the deposition position, the shadow ring lift pins 302 may still be in contact with the bottom of the shadow ring 135 or the shadow ring lift pins 302 may be separated from the shadow ring 135. While in the lowered position, the second height H2 described with respect to FIG. 4B is decreased to be less than about 1 mm, such as less than about 0.5 mm, such as less than about 0.3 mm, such as about 0.2 mm to about 0.3 mm. In some embodiments, the shadow ring lift plate 312 and/or the shadow ring lift arms 304 are disposed on top of and contacting a lower wall 316 of the chamber base 114. Contacting the lower wall 316 of the chamber base 114 may cause the shadow ring lift plate 312 to disengage from the lift hoop 168.

The positioning of each of the shadow ring lift plate 312, the lift hoop 168, and the lift pin bases 310 may be adjusted relative to the length of each of the substrate lift pins 167 and the shadow ring lift pins 302 as well as the desired second distance $D_2$ during treatment and deposition on the substrate 130.

Figure 5A:
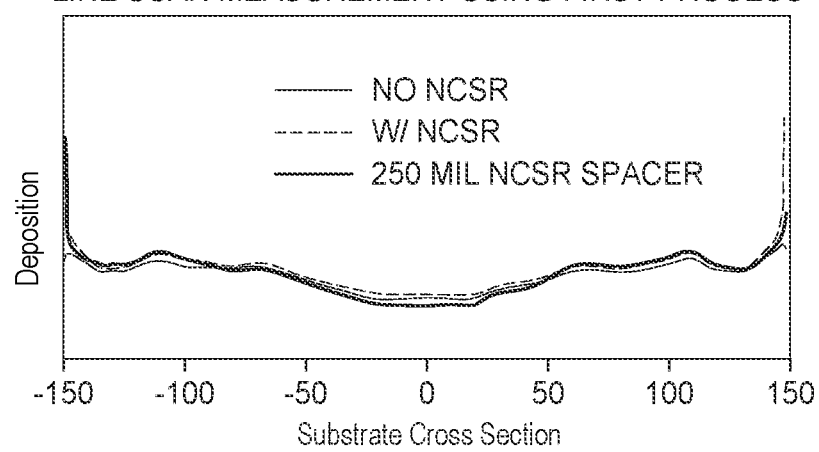
FIGS. 5A-5B illustrate graphs of line scan measurements across the diameter of a substrate after undergoing a first process or a second process, according to embodiments of the disclosure.
Figure 5B:
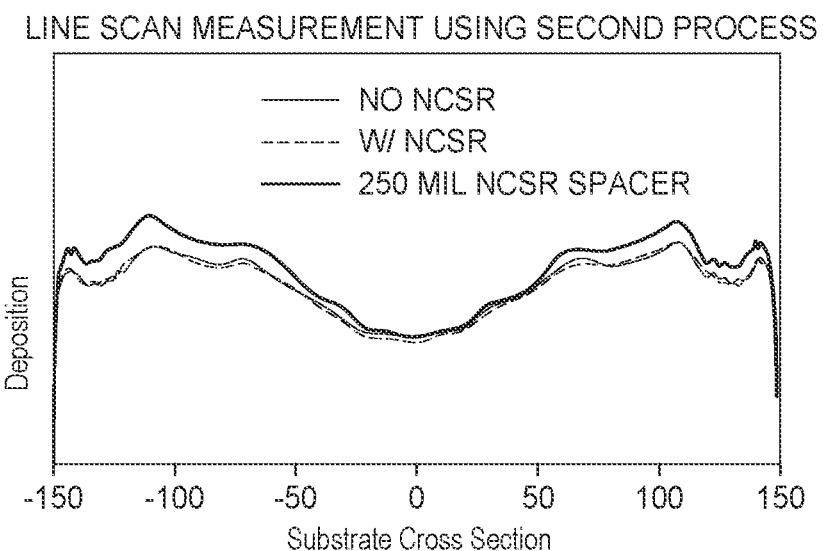

FIGS. 5A-5B illustrate graphs of line scan measurements across the diameter of a substrate after undergoing a first process and a second process. The line scan measurements measure the tungsten (W) film thickness after a nucleation operation, a treatment operation, and a bulk deposition similar to those described in FIGS. 8A-8D and 9A-9C. FIG. 5A illustrates line scan measurements across the diameter of the substrate after undergoing a first process using a first process recipe. FIG. 5B illustrates line scan measurements across the diameter of the substrate after undergoing a second process using a second process recipe. The first process and the second process include a nucleation operation which creates a nucleation layer on a substrate, a treatment operation to form a gradient within a trench on the substrate, and a bulk deposition operation in which a material is deposited within the trench in a bottom-up fill process. The line scan measurements shown herein measure the tungsten (W) film thickness after the bulk deposition operation. The first process and the second process use different precursor concentrations and flow rates during nucleation and treatment of the substrate. Three different tests were performed using each of the first process and the second process. The radical treatment operation described herein may include a differential inhibition process as described in the methods 800, 825, 850, and 875 of FIGS. 8A-8D. A first test was conducted using no shadow ring 135 (No NCSR) during a radical treatment operation. A second test was conducted using the shadow ring 135 disposed adjacent to the substrate 130 (w/NCSR) during a radical treatment operation, such as in the position of FIG. 1A or FIG. 4C. A third test was conducted using a spacer, such as the shadow ring spacer 150 or shadow ring lift pins 302, to separate the shadow ring 135 from the substrate 130 by about 250 mils (250 mil NCSR spacer) during a radical treatment operation.

As shown, in both the first process and the second process, the tungsten (W) film thickness when using either no shadow ring 135 or a shadow ring 135 with a shadow ring spacer 150 (or shadow ring lift pins 302) is more uniform near the edges of the substrate than when the shadow ring 135 is disposed adjacent to the substrate 130 during the radical treatment operation.

Figure 6A:
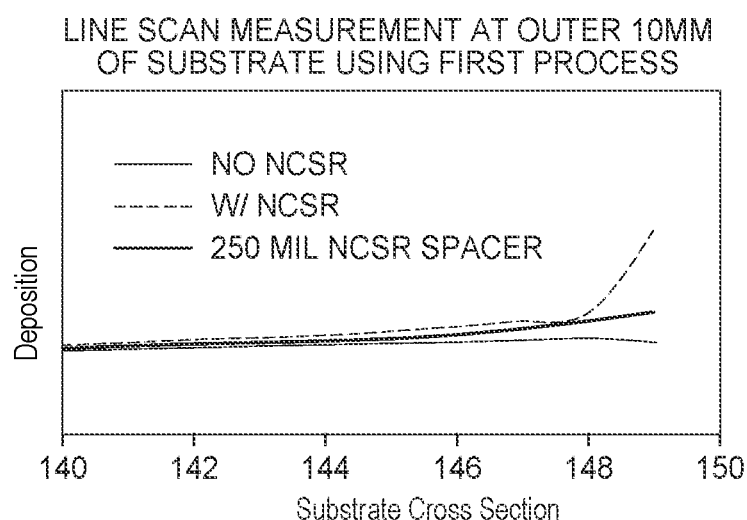
FIGS. 6A-6B illustrate graphs of the line scan measurements of FIGS. 5A-5B for the outer 10 mm of the substrate, according to embodiments of the disclosure.
Figure 6B:
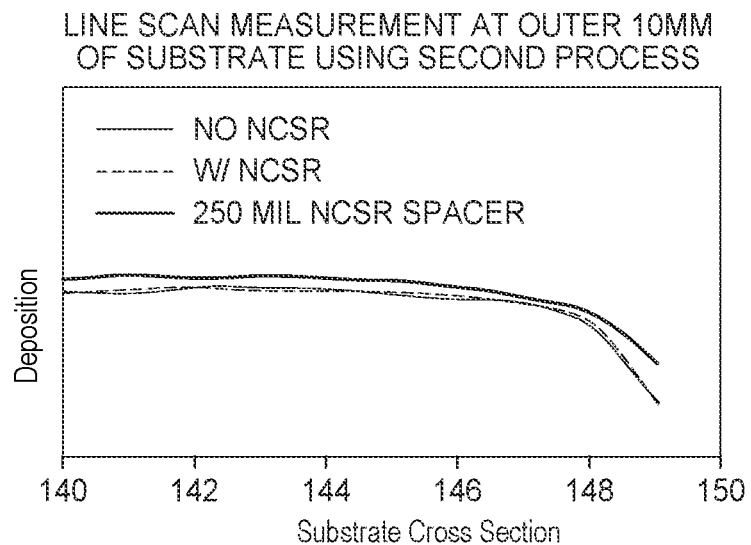

FIGS. 6A-6B illustrate graphs of the line scan measurements of FIGS. 5A and 5B respectively for the outer 10 mm of the substrate. As can be seen in FIGS. 6A-6B, the nitrogen concentration near the edges of the substrate is more uniform in tests performed with either no shadow ring or a shadow ring spaced from the substrate. This is especially prevalent in the first process (FIG. 6A), where a process using the shadow ring adjacent to the substrate (w/NCSR) shows a sharp increase in nitrogen concentration near the edges of the substrate.

Figure 7A:
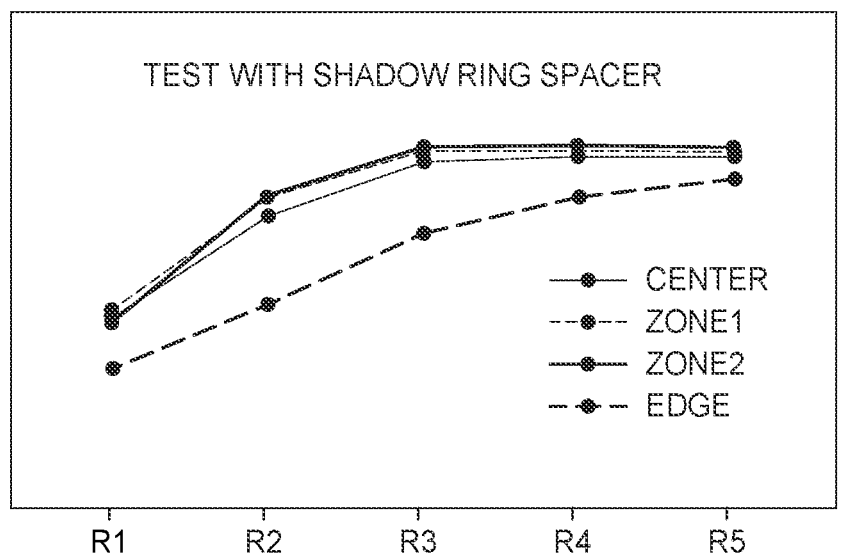
FIGS. 7A-7C illustrate graphs of film saturation at different portions of a substrate while alternating the location of a shadow ring, according to embodiments of the disclosure.
Figure 7B:
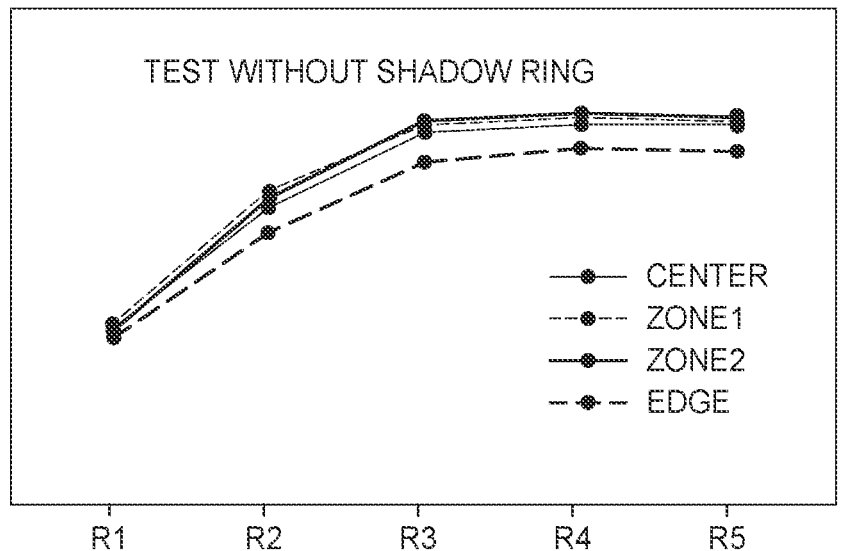
Figure 7C:
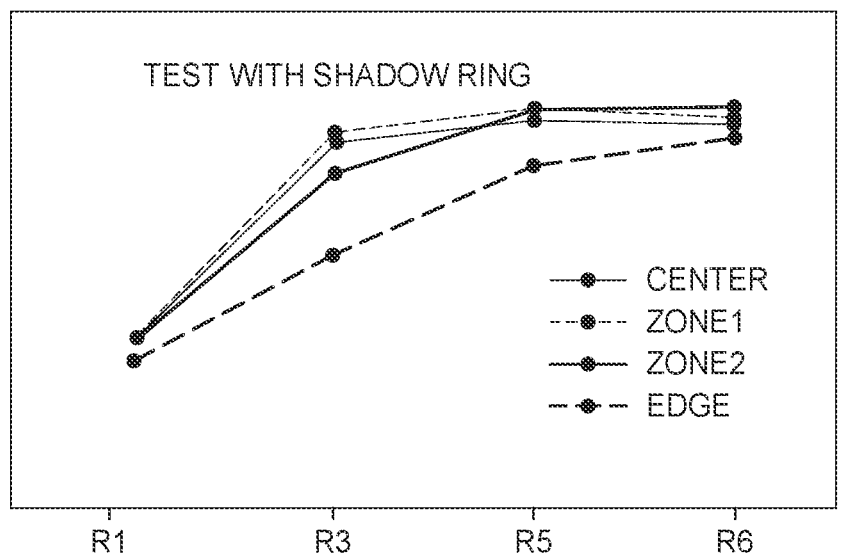

FIGS. 7A-7C illustrate graphs of film thickness reduction across a substrate after nitrogen saturation in a film while alternating the location of a shadow ring or removing the shadow ring altogether during a nitrogen treatment operation. FIG. 7A illustrates the film thickness reduction at different locations on the substrate when using a shadow ring spacer, such as the shadow ring spacer 150 or shadow ring lift pins 302. Therefore, the shadow ring is spaced further from the substrate than it would be without the shadow ring spacer or shadow ring lift pins. After performing each test, the film thickness reduction of the substrate within four different regions is measured. The four regions are a center region (central region of the substrate), zone 1 (annular region radially outward of the center region), zone 2 (annular region radially outward of zone 1), and the edge (annular region radially outward of zone 2). The film thickness reduction was determined after running film treatment operations which used different process recipes, such as a first recipe (R1), a second recipe (R2), a third recipe (R3), a fourth recipe (R4), and a fifth recipe (R5). As shown in FIG. 7A, the film thickness reduction near the edge of the substrate is significantly less than the concentration in the center, zone 1, or zone 2 in all of R1, R2, R3, R4, and R5.

FIG. 7B similarly illustrates the film thickness reduction at different locations on the substrate when using different process recipes, but the shadow ring is not utilized during the nitrogen treatment of the film. Similar process recipes and zone distributions are utilized as in FIG. 7A with the only difference being the removal of the shadow ring from around the edge of the substrate. As illustrated in FIG. 7B, the removal of the shadow ring reduces the difference in film thickness reduction between the edge and each of the center, zone 1, and zone 2. This result is seen regardless of the process recipe (R1, R2, R3, R4, and R5) utilized.

FIG. 7C illustrates the film thickness reduction when the shadow ring is utilized adjacent to the substrate. The results shown in FIG. 7C may be used as a base line to compare the differences between film thickness reduction at different portions of a substrate. Several of the same process recipes (R1, R3, and R5) are utilized as in FIGS. 7A and 7B with the addition of a sixth recipe (R6). As shown in FIG. 7C, when a shadow ring is utilized adjacent to the substrate and without a spacer, the film thickness reduction through the different regions (center, zone 1, zone 2, edge) are less uniform than if a spacer is utilized or the shadow ring is removed entirely.

Each of FIGS. 7A-7C include similar scaling along the film thickness reduction axis. As shown, the tests performed without the shadow ring and with a shadow ring spacer have more uniform film thickness reduction near the edge of the substrates when compared to film thickness reduction near inner regions of the substrate (center region, zone 1, and zone 2).

Figure 8A:
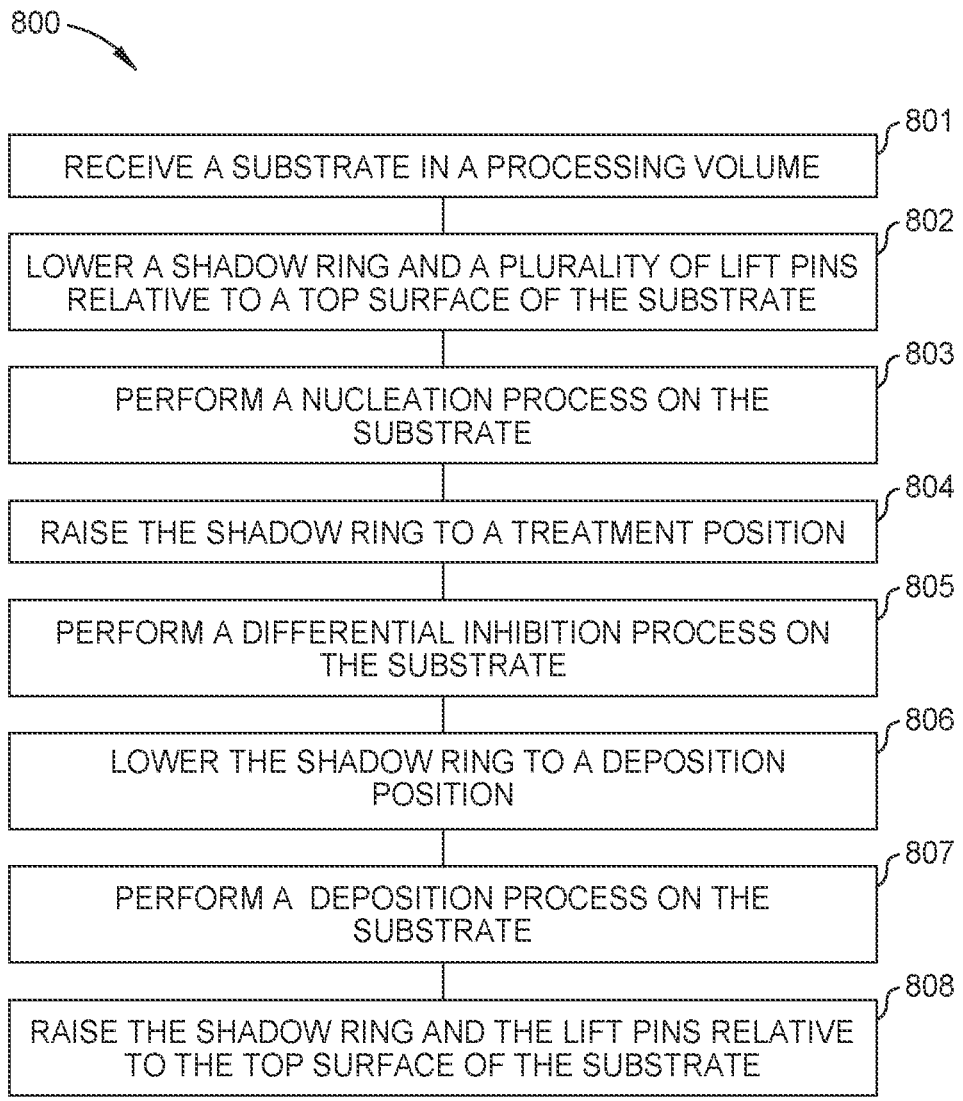
FIGS. 8A-8D illustrate methods of processing a substrate, according to embodiments of the disclosure.
Figure 9A:
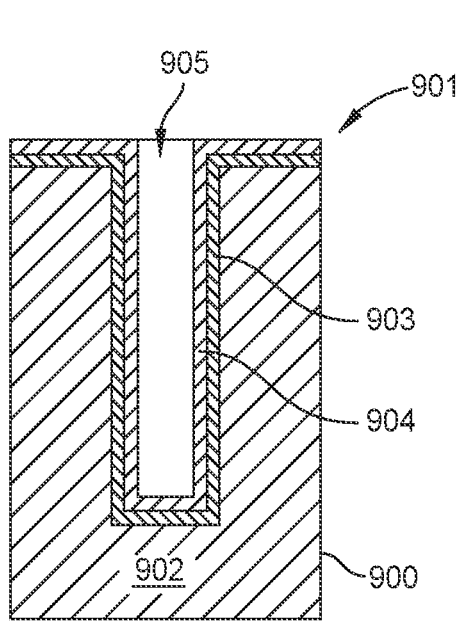
FIGS. 9A-9C are schematic sectional views of a portion of a substrate illustrating various aspects of the methods set forth in FIGS. 8A-8D.
Figure 9B:
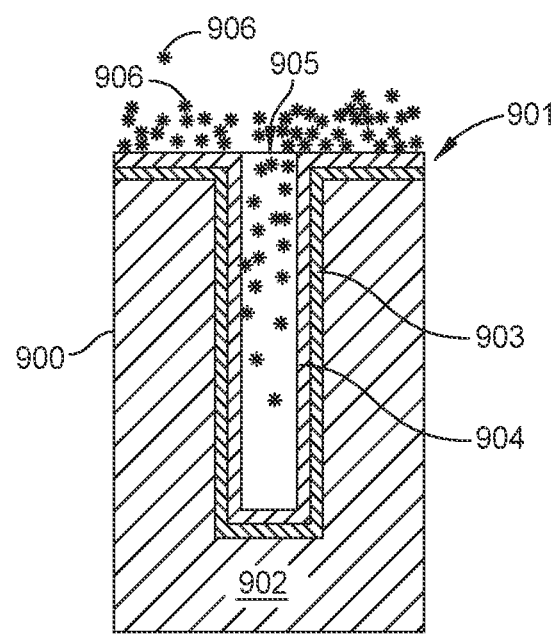
Figure 9C:
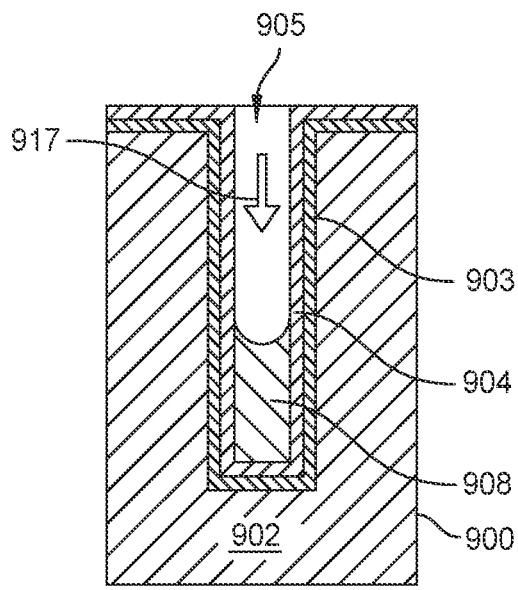

FIG. 8A is a diagram illustrating a method 800 of processing a substrate, according to an embodiment, which may be performed using the processing system 100c. FIGS. 9A-9C are schematic sectional views of a portion of a substrate 900 illustrating aspects of the method 800 at different stages of a void-free and seam-free tungsten gapfill process.

At activity 801, the method 800 includes receiving a substrate into a processing volume 115 of a processing chamber 102. The substrate may be moved into the processing volume 115 by one or more transfer devices or robots (not shown). At activity 802, the method 800 includes lowering a shadow ring and a plurality of substrate lift pins relative to a top surface of the substrate. The shadow ring and the plurality of substrate lift pins are lowered from a transfer position (similar to the transfer position of FIG. 4A) to a deposition position (similar to the deposition position of FIG. 4C). While in the deposition position, the shadow ring is adjacent to the top surface of the substrate 900, such that a bottom surface of the shadow ring is a first spacing from the top surface of the substrate 900. The first spacing is less than about 1 mm, such as less than about 0.5 mm, such as less than about 0.3 mm, such as about 0.2 mm to about 0.3 mm from the top surface of the substrate 900. The first spacing may also be referred to as a deposition spacing. The shadow ring may assist in controlling the nucleation layer 904 as formed in activity 803.

The lowering of the shadow ring and the plurality of substrate lift pins relative to the top surface of the substrate may include moving a substrate support assembly, such as the substrate support assembly 120, on which the substrate is disposed. In some embodiments, the substrate support assembly is moved vertically upwards towards a showerhead while the shadow ring and the plurality of substrate lift pins remain in place. In some embodiments, the shadow ring and the plurality of substrate lift pins move in a vertically upward direction overall during the activity 802, but move in a vertically downward direction with respect to the top surface of the substrate 900 and with the substrate support assembly 120.

At activity 803, the method 800 includes forming a nucleation layer 904 on the substrate using a nucleation process. A portion of an exemplary substrate 900 having the nucleation layer 904 formed thereon is schematically illustrated in FIG. 9A.

Here, the substrate 900 features a patterned surface 901 comprising a dielectric material layer 902 having a plurality of openings 905 (one shown) formed therein. In some embodiments, the plurality of openings 905 comprises one or a combination of high aspect ratio via or trench openings having a width of about 1 μm or less, such as about 800 nm or less, or about 500 nm or less, and a depth of about 2 μm or more, such as about 3 μm or more, or about 4 μm or more. In some embodiments, individual ones of the openings 905 may have an aspect ratio (depth to width ratio) of about 5:1 or more, such as about 10:1 or more, 15:1 or more, or between about 10:1 and about 40:1, such as between about 15:1 and about 40:1. As shown, the patterned surface 901 includes a barrier or adhesion layer 903, e.g., a titanium nitride (TiN) layer, deposited on the dielectric material layer 902 to conformally line the openings 905 and facilitate the subsequent deposition of the tungsten nucleation layer 904. In some embodiments, the adhesion layer 903 is deposited to a thickness of between about 2 angstroms (Å) and about 100 Å.

In some embodiments, the method 800 includes depositing the adhesion layer 903 using a second processing chamber of a multi-chamber processing system, before receiving the substrate into the processing chamber 102. In some embodiments, the method 800 includes sequentially depositing the adhesion layer 903 and the nucleation layer 904 in the same processing chamber 102. In some embodiments, the adhesion layer 903 functions as a nucleation layer enabling subsequent bulk tungsten deposition thereon. In embodiments where the adhesion layer 903 functions as a nucleation layer, the method 800 may not include activity 803.

In some embodiments, the nucleation layer 904 is deposited using an atomic layer deposition (ALD) process. Typically, the ALD process includes repeating cycles of alternately exposing the substrate 900 to a tungsten-containing precursor, exposing the substrate 900 to a reducing agent, and purging the processing region 121 between the alternating exposures. Examples of suitable tungsten-containing precursors include tungsten halides, such as tungsten hexafluoride ($WF_6$), tungsten hexachloride ($WCl_6$), or combinations thereof. Examples of suitable reducing agents include hydrogen gas ($H_2$), boranes, e.g., $B_2H_6$, and silanes, e.g., $SiH_4$, $Si_2H_6$, or combinations thereof. In some embodiments, the tungsten-containing precursor comprises $WF_6$, and the reducing agent comprises $B_2H_6$, $SiH_4$, or a combination thereof. In some embodiments, the tungsten-containing precursor comprises an organometallic precursor and/or a fluorine-free precursor, e.g., MDNOW (methylcyclopentadienyl-dicarbonylnitrosyl-tungsten), EDNOW (ethylcyclopentadienyl-dicarbonylnitrosyl-tungsten), tungsten hexacarbonyl ($W(CO)6$), or combinations thereof.

During the nucleation process, the processing volume 115 is typically maintained at a pressure of less than about 120 Torr, such as of between about 900 mTorr and about 120 Torr, between about 1 Torr and about 100 Torr, or for example, between about 1 Torr and about 50 Torr. Exposing the substrate 900 to the tungsten-containing precursor includes flowing the tungsten-containing precursor into the processing region 121 from the deposition gas source 140 at a flow rate of more than about 10 sccm, such as between about 10 sccm and about 1000 sccm, such as between about 10 sccm and about 750 sccm, or between about 10 sccm and about 500 sccm. Exposing the substrate 900 to the reducing agent includes flowing the reducing agent into the processing region 121 from the deposition gas source 140 at a flow rate of between about 10 sccm and about 1000 sccm, such as between about 10 sccm and about 750 sccm. It should be noted that the flow rates for the various deposition and treatment processes described herein are for a processing system 100c configured to process a 300 mm diameter substrate. Appropriate scaling may be used for processing systems configured to process different-sized substrates.

Here, the tungsten-containing precursor and the reducing agent are each flowed into the processing region 121 for a duration of between about 0.1 seconds and about 10 seconds, such as between about 0.5 seconds and about 5 seconds. The processing region 121 may be purged between the alternating exposures by flowing an inert purge gas, such as argon (Ar), into the processing region 121 for a duration of between about 0.1 seconds and about 10 seconds, such as between about 0.5 seconds and about 5 seconds. The purge gas may be delivered from the deposition gas source 140 or from the bypass gas source 138. Typically, the repeating cycles of the nucleation process continue until the nucleation layer 904 has a thickness of between about 10 Å and about 200 Å, such as between about 10 Å and about 150 Å, or between about 20 Å and about 150 Å. The presence of the shadow ring adjacent to the substrate 900 during the activity 803 reduces the deposition rater near the beveled edge of the substrate 900.

At activity 804, the method 800 includes raising the shadow ring to a treatment position (similar to the treatment position of FIG. 4B) from the deposition position (similar to the deposition position of FIG. 4C). The treatment position includes having the substrate lift pins in a lowered position while the shadow ring is in a raised position with respect to the substrate 900. The positioning of shadow ring may be adjusted to be higher or lower as desired. The shadow ring is raised prior to the activity 805. Raising the shadow ring includes actuating a lift hoop in a vertically upward direction and using the shadow ring lift pins to raise the shadow ring. The substrate lift pins may remain in place while the shadow ring is actuated between the deposition and the treatment positions. Therefore, the substrate remains on top of and contacting the substrate support 122 during the treatment operation. During the raising of the shadow ring, the substrate support remains stationary to enable the overall distance between the shadow ring and a top surface of the substrate support to increase. In embodiments described herein, the distance between the bottom of the shadow ring and the top surface of the substrate is a second height H2 of about 0.5 mm to about 11 mm, such as about 1 mm to about 11 mm, such as about 5 mm to about 10 mm, such as about 6 mm to about 6.5 mm, such as about 6.35 mm. In some embodiments, the second height H2 is defined as a treatment spacing. Raising the shadow ring has been shown to improve the uniformity of the treatment performed during activity 805. In embodiments described herein, the shadow ring is raised about 9 mm to about 15 mm, such as about 10 mm to about 14 mm, such as about 11 mm to about 13 mm.

At activity 805, the method 800 includes treating the nucleation layer 904 to inhibit tungsten deposition on a field surface of the substrate 900 and to form a differential inhibition profile in the plurality of openings 905 by use of a differential inhibition process. Typically, forming the differential inhibition profile includes exposing the nucleation layer 904 to the activated species of a treatment gas, e.g., the treatment radicals 906 shown in FIG. 9B. Suitable treatment gases that may be used for the inhibition process include $N_2$, $H_2$, $NH_3$, $NH_4$, $O_2$, $CH_4$, or combinations thereof. In some embodiments, the treatment gas comprises nitrogen, such as $N_2$, $H_2$, $NH_3$, $NH_4$, or a combination thereof, and the activated species comprise nitrogen radicals, e.g., atomic nitrogen. In some embodiments, the treatment gas is combined with an inert carrier gas, such as Ar, He, or a combination thereof, to form a treatment gas mixture.

Without intending to be bound by theory, it is believed that the activated nitrogen species (treatment radicals 906) are incorporated into portions of the nucleation layer 904 by adsorption of the activated nitrogen species and/or by reaction with the metallic tungsten of the nucleation layer 904 to form a tungsten nitride (WN) surface. The adsorbed nitrogen and/or nitrided surface of the tungsten nucleation layer 904 desirably delays (inhibits) further tungsten nucleation and thus subsequent tungsten deposition thereon.

Generally, diffusion of the treatment radicals 906 into the plurality of openings 905 is controlled to cause a desired inhibition gradient within the feature openings 905. Here, diffusion of the treatment radicals 906 is controlled so that the tungsten growth inhibition effect decreases on the walls of the openings 905 with increasing distance from the field of the patterned surface 901 (FIGS. 9B-9C). As a result, tungsten nucleation is more easily established at locations at or near the bottom of the feature, and once established, tungsten growth (deposition of the gapfill material 908) within the openings 905 accelerates from the point of nucleation (e.g., from regions of no or low inhibition at the bottom of the opening 905) to provide for a bottom-up seamless tungsten gapfill. The direction of the inhibition gradient, from regions of higher inhibition to regions of no or lower inhibition, is shown by arrow 917 (FIG. 9C). Diffusion of the treatment radicals 906 into the openings 905 typically depends, at least in part, on the size and aspect ratios of the openings 905 and may be adjusted by controlling inter alia, the energy, flux, and, in some embodiments, the directionality of the treatment radicals 906 at the patterned surface 901.

In some embodiments, exposing the nucleation layer 904 to the treatment radicals 906 includes forming a treatment plasma of a substantially halogen-free treatment gas mixture using the first radical generator 106A and flowing the effluent of the treatment plasma into the processing region 121. In some embodiments, a flow rate of the treatment gas mixture into the first radical generator 106A, and thus the flow rate of the treatment plasma effluent into the processing region 121, is between about 1 sccm and about 3000 sccm, such as between about 1 sccm and about 2500 sccm, between about 1 sccm and about 2000 sccm, between about 1 sccm and about 1000 sccm, between about 1 sccm and about 500 sccm, between about 1 sccm and about 250 sccm between about 1 sccm and about 100 sccm, or between about 1 sccm and about 75 sccm, for example, between about 1 sccm and about 50 sccm.

In some embodiments, a concentration of the substantially halogen-free treatment gas in the treatment gas mixture is between about 0.5 vol. % and about 50 vol. %, such as between about 0.5 vol. % and about 40 vol. %, between about 0.5 vol. % and about 30 vol. %, about 0.5 vol. % and about 20 vol. %, or, for example, between about 0.5 vol. % and about 10 vol. %, such as between about 0.5 vol. % and about 5 vol. %.

In some embodiments, e.g., where the substantially halogen-free treatment gas comprises $N_2$, $NH_3$, and/or $NH_4$, the first radical generator 106A may be used to activate between about 0.02 mg and about 150 mg of atomic nitrogen during an inhibition treatment process for a 300 mm diameter substrate, such as between about 0.02 mg and about 150 mg, or between about 0.02 mg and about 100 mg, between about 0.1 mg and about 100 mg, between about 0.1 mg and about 100 mg, or between about 1 mg and about 100 mg. In some embodiments, the first radical generator 106A may be used to activate about 0.02 mg of atomic nitrogen or more during an inhibition treatment process for a 300 mm diameter substrate, such as about 0.2 mg or more, about 0.4 mg or more, about 0.6 mg or more, about 0.8 mg or more, about 1 mg or more, about 1.2 mg or more, about 1.4 mg or more, about 1.6 mg or more, about 1.8 mg or more, about 2 mg or more, about 2.2 mg or more, about 2.4 mg or more, about 2.6 mg or more, about 2.8 mg, or about 3 mg or more. Appropriate scaling may be used for processing systems configured to process different sized substrates.

In other embodiments, the treatment radicals 906 may be formed using a remote plasma (not shown) which is ignited and maintained in a portion of the processing volume 115 that is separated from the processing region 121 by the showerhead 118, such as between the showerhead 118 and the lid plate 116. In those embodiments, the activated treatment gas may be flowed through an ion filter to remove substantially all ions therefrom before the treatment radicals 906 reach the processing region 121 and the surface of the substrate 900. In some embodiments, the showerhead 118 may be used as the ion filter. In other embodiments, a plasma used to form the treatment radicals is an in-situ plasma formed in the processing region 121 between the showerhead 118 and the substrate 900. In some embodiments, e.g., when using an in-situ treatment plasma, the substrate 900 may be biased to control the directionality and/or accelerate ions formed from the treatment gas, e.g., charged treatment radicals, towards the substrate surface.

After the differential inhibition process of activity 805, the shadow ring 135 is lowered to a deposition position similar to the position shown in FIG. 4C. The shadow ring 135 is lowered to the deposition position during activity 806. The shadow ring 135 is lowered by lowering the lift hoop 168. The lift pins may remain in place relative to the substrate support 122 and hang free from the substrate support 122. While in the deposition position, the shadow ring is adjacent to the top surface of the substrate 900, such that a bottom surface of the shadow ring is a first spacing from the top surface of the substrate 900. The first spacing is less than about 1 mm, such as less than about 0.5 mm, such as less than about 0.3 mm, such as about 0.2 mm to about 0.3 mm from the top surface of the substrate 900. The shadow ring may assist in controlling the deposition of the gapfill material 908 on the bevel edges of the substrate 900 during activity 807.

At activity 807, the method 300 includes selectively depositing a tungsten gapfill material 908 (FIG. 9C) into the plurality of openings 905 according to the differential inhibition profile provided by the inhibition treatment at activity 805. In one embodiment, the tungsten gapfill material 908 is formed using a low-stress chemical vapor deposition (CVD) process comprising concurrently flowing (co-flowing) a tungsten-containing precursor gas, and a reducing agent into the processing region 121 and exposing the substrate 900 thereto. The tungsten-containing precursor and the reducing agent used for the tungsten gapfill CVD process may comprise any combination of the tungsten-containing precursors and reducing agents described in activity 803. In some embodiments, the tungsten-containing precursor comprises $WF_6$, and the reducing agent comprises $H_2$, $B_2H_6$, $SiH_4$, or a combination thereof.

Here, the tungsten-containing precursor is flowed into the processing region 121 at a rate of between about 50 sccm and about 1000 sccm, or more than about 50 sccm, or less than about 1000 sccm, or between about 100 sccm and about 900 sccm. The reducing agent is flowed into the processing region 121 at a rate of more than about 500 sccm, such as more than about 750 sccm, more than about 1000 sccm, or between about 500 sccm and about 10000 sccm, such as between about 1000 sccm and about 9000 sccm, or between about 1000 sccm and about 8000 sccm.

In some embodiments, the tungsten gapfill CVD process conditions are selected to provide a tungsten feature having a relativity low residual film stress when compared to conventional tungsten CVD processes. For example, in some embodiments, the tungsten gapfill CVD process includes heating the substrate to a temperature of about 250° C. or more, such as about 300° C. or more, or between about 250° C. and about 600° C., or between about 300° C. and about 500° C. During the CVD process, the processing region 121 is typically maintained at a pressure of less than about 500 Torr, less than about 600 Torr, less than about 500 Torr, less than about 400 Torr, or between about 1 Torr and about 500 Torr, such as between about 1 Torr and about 450 Torr, or between about 1 Torr and about 400 Torr, or for example, between about 1 Torr and about 300 Torr.

In another embodiment, the tungsten gapfill material 908 is deposited at activity 807 using an atomic layer deposition (ALD) process. The tungsten gapfill ALD process includes repeating cycles of alternately exposing the substrate 900 to a tungsten-containing precursor gas and a reducing agent and purging the processing region 121 between the alternating exposures. The tungsten-containing precursor and the reducing agent used for the tungsten gapfill ALD process may comprise any combination of the tungsten-containing precursors and reducing agents described in activity 803. In some embodiments, the tungsten-containing precursor comprises $WF_6$, and the reducing agent comprises $H_2$.

Here, the tungsten-containing precursor and the reducing agent are each flowed into the processing region 121 for a duration of between about 0.1 seconds and about 10 seconds, such as between about 0.5 seconds and about 5 seconds. The processing region 121 is typically purged between the alternating exposures by flowing an inert purge gas, such as argon (Ar), into the processing region 121 for a duration of between about 0.1 seconds and about 10 seconds, such as between about 0.5 seconds and about 5 seconds.

Exposing the substrate 900 to the tungsten-containing precursor may include flowing the tungsten-containing precursor into the processing region 121 from the deposition gas source 140 at a flow rate of between about 10 sccm and about 1000 sccm, such as between about 100 sccm and about 1000 sccm, between about 200 sccm and about 1000 sccm, between about 400 sccm and about 1000 sccm, or between about 500 sccm and about 900 sccm. Exposing the substrate 900 to the reducing agent may include flowing the reducing agent into the processing region 121 from the deposition gas source 140 at a flow rate of between about 500 sccm and about 10000 sccm, such as between about 500 sccm and about 8000 sccm, between about 500 sccm and about 5000 sccm, or between about 1000 sccm and about 4000 sccm.

In some embodiments, the tungsten gapfill ALD process includes heating the substrate to a temperature of about 250° C. or more, such as about 300° C. or more, or between about 250° C. and about 600° C., or between about 300° C. and about 500° C. In some embodiments, the ALD process includes maintaining the processing region 121 at a pressure of less than about 150 Torr, less than about 100 Torr, less than about 50 Torr, for example, less than about 30 Torr, or between about 0.5 Torr and about 50 Torr, such as between about 1 Torr and about 20 Torr.

In other embodiments, the tungsten gapfill material 908 is deposited using a pulsed CVD method that includes repeating cycles of alternately exposing the substrate 900 to a tungsten-containing precursor gas and a reducing agent without purging the processing region 121. The processing conditions for the tungsten gapfill pulsed CVD method may be the same, substantially the same, or within the same ranges as those described above for the tungsten gapfill ALD process.

At activity 808, the method 800 includes raising both the shadow ring and the substrate lift pins relative to the top surface of the substrate. During the activity 808, the shadow ring and the substrate lift pins may be raised to a transfer position, such as the transfer position of FIG. 4A. The substrate and the substrate support may also be lowered to the transfer position of FIG. 4A either simultaneously to, before, or after the raising of the shadow ring and the substrate lift pins relative to the substrate support. The activity 808 is performed after the deposition process of activity 807. The shadow ring and the substrate lift pins may be lifted to the transfer position from either the treatment position (FIG. 4B) or the lowered position (FIG. 4C). As described herein, the shadow ring and the substrate lift pins are positioned such that a lift hoop, such as the lift hoop 168, is contacting a base of each of the substrate lift pins, such as the lift pin base 310. The actuation of the lift hoop further separates the substrate support and the shadow ring, such that the shadow ring is separated from the top surface of the substrate support. The substrate lift pins are actuated such that the top of each of the substrate lift pins is disposed above the top surface of the substrate support and the substrate 900 is separated from the top surface of the substrate support. Separating the substrate 900 from the substrate support enables the substrate 900 to be subsequently removed from the processing region of the process chamber through the opening formed between the shadow ring and the substrate support.

In some embodiments, the substrate support is actuated vertically downward during the activity 808, such that a top surface of the substrate support is either aligned with or below an opening, such as the opening 314, within a sidewall of the process chamber. If the substrate support is actuated vertically downward, the lift pins and the shadow ring may be raised relative to the top surface of the substrate without being moved. In some embodiments, the lift pins and the shadow ring are actuated vertically downward and away from a showerhead, but the substrate support moves downward by a greater amount or at a greater overall velocity. Therefore, even if both the lift pins and the shadow ring are being actuated downward, the lift pins and the shadow ring may be actuated away from the top surface of the substrate support. In some embodiments, the shadow ring and the lift pins may remain in place while the substrate support moves downward until the lift pins are positioned with an upper portion disposed above the substrate support surface of the substrate support.

Figure 8B:
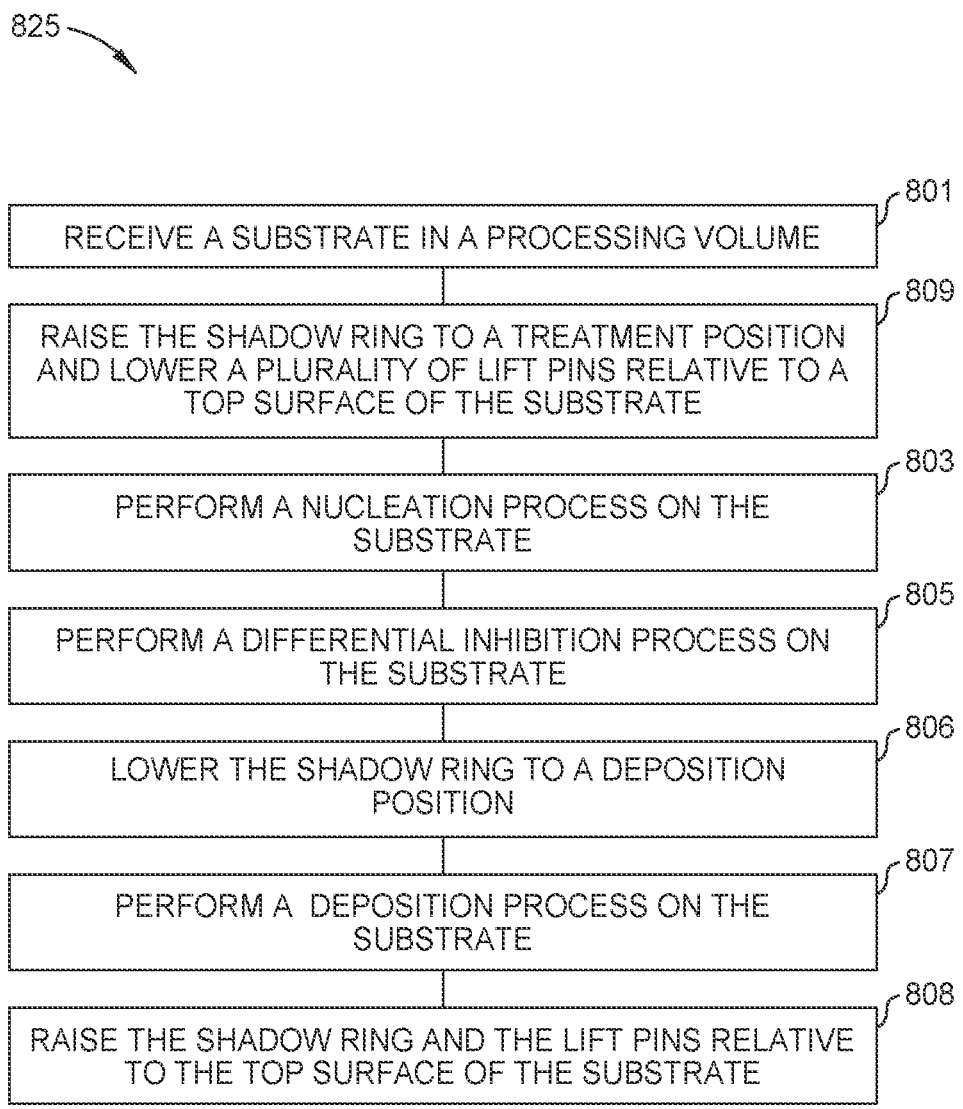

FIG. 8B is a diagram illustrating a method 825 of processing a substrate, according to an embodiment, which may be performed using the processing system 100c. FIGS. 9A-9C are schematic sectional views of a portion of a substrate 900 illustrating aspects of the method 825 at different stages of a void-free and seam-free tungsten gapfill process. The method 825 is similar to the method 800 of FIG. 8A, but activity 802 and activity 804 are omitted, while activity 809 is added. Activity 809 replaces activity 802. Activity 809 is performed after the substrate is received within the processing volume during activity 801 and before performing the nucleation process of activity 803.

Activity 809 includes raising a shadow ring to a treatment position and lowering a plurality of substrate lift pins relative to a top surface of the substrate. The plurality of substrate lift pins are lowered from a transfer position (similar to the transfer position of FIG. 4A) to a treatment position (similar to the deposition position of FIG. 4B). While in the treatment position, the shadow ring is a second height H2 from the top surface of the substrate 900/the top surface of the substrate support, such that a bottom surface of the shadow ring is a first spacing from the top surface of the substrate 900/top surface of the substrate support. The second height is less than about less than about 12 mm, such as about 2 mm to about 11 mm, such as about 2 mm to about 10 mm from the top surface of the substrate 900 or the top surface of the substrate support.

The shadow ring is spaced from the top surface of the substrate 900 in order to enable improved nitrogen treatment during the differential inhibition operation of activity 805. It has been shown that due to the small thickness of the nucleation layer 904 as formed in activity 803, the nucleation layer 904 is still relatively uniform regardless of if the shadow ring is spaced from the top surface of the substrate or disposed adjacent to the top surface of the substrate. Therefore, the position of the shadow ring, in some embodiments, is held constant between the nucleation process of activity 803 and the differential inhibition process of activity

804. Holding the shadow ring in a constant position between activity 803 and activity 804 may reduce the overall process time.

The raising of the shadow ring and the lowering of the plurality of substrate lift pins relative to the top surface of the substrate may include moving a substrate support assembly, such as the substrate support assembly 120, on which the substrate is disposed. In some embodiments, the substrate support assembly is moved vertically upwards towards a showerhead while the shadow ring and the plurality of substrate lift pins remain in place. In some embodiments, the shadow ring and the plurality of substrate lift pins move in a vertically upward direction overall during the activity 802, but move in a vertically downward direction with respect to the top surface of the substrate 900 and with the substrate support assembly 120.

Figure 8C:
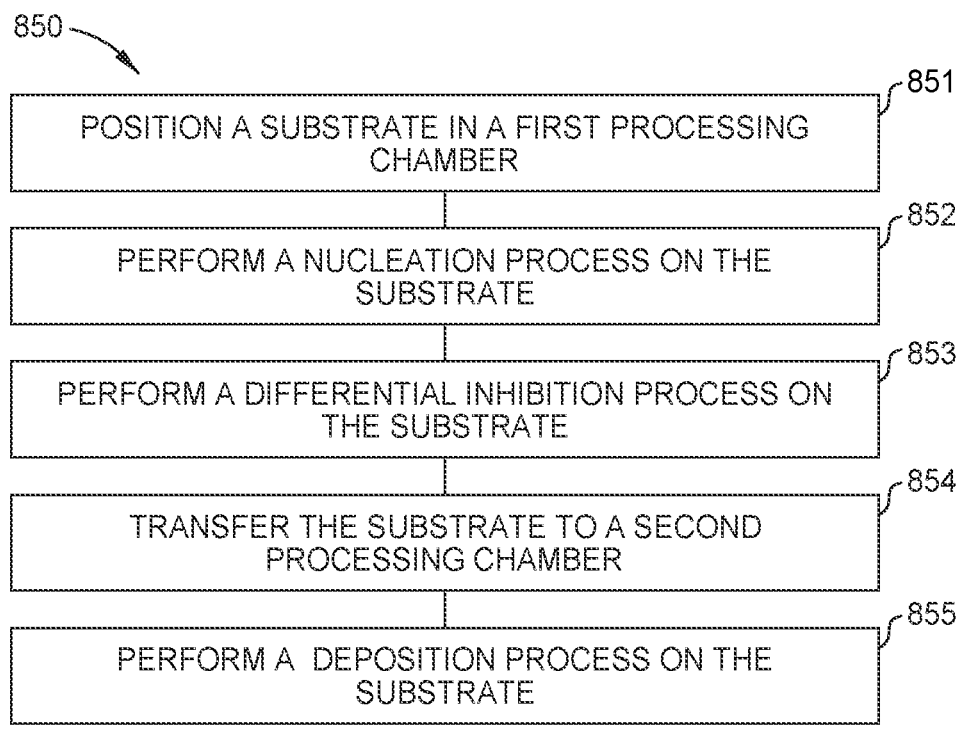

FIG. 8C is another diagram illustrating a method 850 of processing a substrate, according to an embodiment, which may be performed using the processing systems 100a and 100b of FIGS. 1A-1B. FIGS. 9A-9C may also be utilized as schematic sectional views of a portion of a substrate 900 illustrating aspects of the method 850 at different stages of a void-free and seam-free tungsten gapfill process scheme.

At activity 851, the substrate 900 is positioned in a first processing chamber, such as the processing chamber 102, of a first processing system. The first processing system may be the processing system 100b of FIG. 1B. The first processing system includes a shadow ring disposed within the processing chamber and a spacer, such as the shadow ring spacer 150, to further separate the shadow ring from the substrate 900. The substrate 900 may be placed within the first processing chamber by one or more transfer devices, such as a robot. Once the substrate 900 is placed on a substrate support surface of the substrate support, such as the substrate support 122, the substrate support 122 may be actuated upwards to a processing position. The processing position is similar to that shown in FIG. 1B. The shadow ring is spaced from the first annular liner 127 using the spacer. The spacer further provides a gap between the substrate and the bottom surface of the shadow ring. The spacer enables the distance between the shadow ring and the substrate to be increased, while maintaining the same distance between the substrate and the showerhead for the nucleation process and a differential inhibition process (treatment process) as well as the bulk deposition process. In some embodiments, the second processing chamber does not include either of the shadow ring spacer 150 or the shadow ring 135.

After activity 851, a nucleation process is performed on the substrate 900 during an activity 852. The activity 852 is similar to the nucleation process performed during the activity 803 of the method 800 of FIG. 8A. The nucleation process is performed in the first processing chamber and at a treatment position, such that the substrate support is in a raised position and the shadow ring is spaced from the top surface of the substrate.

After activity 852, a differential inhibition process is performed on the substrate 900 during an activity 853. The differential inhibition process is a treatment operation and is similar to the differential inhibition process of activity 805 of the method 800 of FIG. 8A. The differential inhibition process is performed in the first processing chamber and at a treatment position, such that the substrate support is in the raised position of activity 852.

In some embodiments, the shadow ring and the spacer are not present during the nucleation process of activity 852 or the differential inhibition process of activity 853, such that the first processing chamber does not include the shadow ring and the spacer. In these embodiments, the volume between the substrate 900 and a showerhead, such as the showerhead 118, or another portion of a plate stack does not include any other chamber components and the showerhead has a linear line of sight to each portion of the substrate 900.

After the differential inhibition process of activity 853, the substrate 900 is transferred to a second processing chamber, such as a processing chamber 102, of a second processing system during an activity 854. The second processing system is similar to the processing system 100a of FIG. 1A. The substrate 900 is moved between the first processing chamber and the second processing chamber using a transfer device, such as a robot. In some embodiments, the substrate 900 may be moved through a transfer chamber while passing between the first processing chamber and the second processing chamber. The second processing system does not includes a spacer. The lack of the spacer enables the distance between the shadow ring and the substrate to be decreased, while maintaining the same distance between the substrate and the showerhead for both the treatment processes of activities 852 and 853 as well as the deposition process of activity 855.

After the substrate 900 is transferred to the second processing chamber during activity 854, a deposition process is performed on the substrate during activity 855. The deposition process is a bulk deposition process and may be similar to the deposition process 807 of FIG. 8A. The deposition process of activity 855 is performed in the second processing chamber to reduce the deposition rate near the beveled edge of the substrate 900. The second processing chamber is configured such that the distance between the top surface of the substrate 900 and the bottom surface of the shadow ring is reduced during the activity 855 relative to the distance during activities 852 and 853.

Performing the treatment processes of activities 852 and 853 in a separate chamber from the deposition process of activity 855 enables the spacing of the shadow ring to be changed between the two processes without reconfiguration of the processing chambers or the process parameters.

Figure 8D:
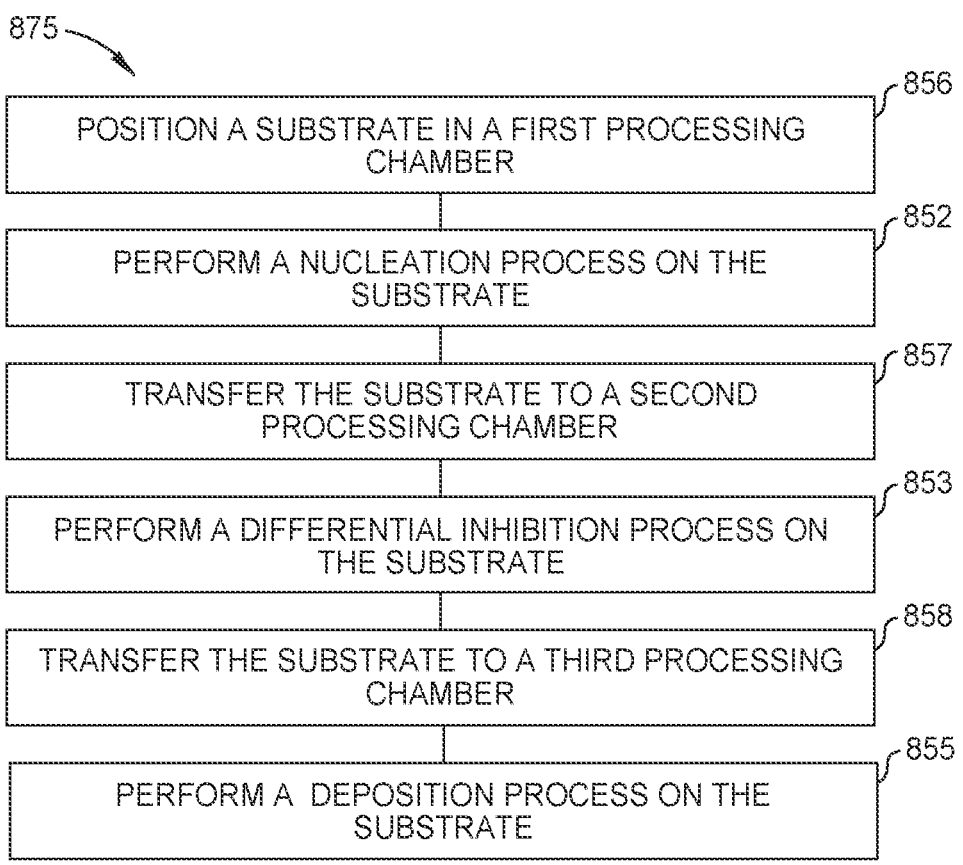

FIG. 8D is another diagram illustrating a method 875 of processing a substrate, according to an embodiment, which may be performed using the processing systems 100a and 100b of FIGS. 1A-1B. FIGS. 9A-9C may also be utilized as schematic sectional views of a portion of a substrate 900 illustrating aspects of the method 875 at different stages of a void-free and seam-free tungsten gapfill process scheme.

At activity 856, the substrate 900 is positioned in a first processing chamber, such as the processing chamber 102, of a first processing system. The first processing system may be the processing system 100a of FIG. 1A. The first processing system includes a shadow ring disposed within the processing chamber, but does not include a spacer to further separate the shadow ring from the substrate 900. The substrate 900 may be placed within the first processing chamber by one or more transfer devices, such as a robot. Once the substrate 900 is placed on a substrate support surface of the substrate support, such as the substrate support 122, the substrate support 122 may be actuated upwards to a processing position. The processing position is similar to that shown in FIG. 1A.

After activity 851, a nucleation process is performed on the substrate 900 during an activity 852. The activity 852 is similar to the nucleation process performed during the activity 803 of the method 800 of FIG. 8A. The nucleation process is performed in the first processing chamber.

After the nucleation process of activity 852, the substrate 900 is transferred to a second processing chamber, such as a processing chamber 102, of a second processing system during an activity 857. The second processing system is similar to the processing system 100b of FIG. 1B. The substrate 900 is moved between the first processing chamber and the second processing chamber using a transfer device, such as a robot. In some embodiments, the substrate 900 may be moved through a transfer chamber while passing between the first processing chamber and the second processing chamber. The second processing system includes a spacer, such as the shadow ring spacer 150, which separates the shadow ring from the first annular liner 127. The spacer further provides a gap between the substrate and the bottom surface of the shadow ring. The spacer enables the distance between the shadow ring and the substrate to be increased, while maintaining the same distance between the substrate and the showerhead for both the nucleation process and a differential inhibition process (treatment process). In some embodiments, the second processing chamber does not include either of the shadow ring spacer 150 or the shadow ring 135.

After activity 857, a differential inhibition process is performed on the substrate 900 during an activity 853. The differential inhibition process is a treatment operation and is similar to the differential inhibition process of activity 805 of the method 800 of FIG. 8A. The differential inhibition process is performed in the second processing chamber and at a treatment position, such that the substrate support is in a raised position.

Performing the nucleation process of activity 852 and the differential inhibition process of activity 854 in separate chambers enables the spacing of the shadow ring to be changed between the two processes without reconfiguration of the processing chambers or the process parameters.

In some embodiments, the shadow ring and the spacer are not present during the differential inhibition process of activity 853, such that the second processing chamber does not include the shadow ring and the spacer. In these embodiments, the volume between the substrate 900 and a showerhead, such as the showerhead 118, or another portion of a plate stack does not include any other chamber components and the showerhead has a linear line of sight to each portion of the substrate 900.

After the differential inhibition process of activity 853, the substrate 900 is transferred to a third processing chamber, such as a processing chamber 102, of a third processing system during an activity 854. The third processing system is similar to the processing system 100a of FIG. 1A. The substrate 900 is moved between the second processing chamber and the third processing chamber using a transfer device, such as a robot. In some embodiments, the substrate 900 may be moved through a transfer chamber while passing between the second processing chamber and the third processing chamber. The third processing system does not includes a spacer. The lack of the spacer enables the distance between the shadow ring and the substrate to be decreased, while maintaining the same distance between the substrate and the showerhead for both the treatment processes of activities 852 and 853 as well as the deposition process of activity 855. In some embodiments, the third processing system is the same as the first processing system, such that only a first processing system and a second processing system are utilized. The third processing system is the same as the first processing system when the substrate support during both the nucleation and the bulk deposition process operations are configured to be the same temperature. In embodiments wherein the substrate support is configured to be held at different temperatures during the nucleation and the bulk deposition operations, three different processing systems are utilized.

After the substrate 900 is transferred to the third processing chamber during activity 858, a deposition process is performed on the substrate during activity 855. The deposition process is a bulk deposition process and may be similar to the deposition process 807 of FIG. 8A. The deposition process of activity 855 is performed in the third processing chamber to reduce the deposition rate near the beveled edge of the substrate 900. The third processing chamber is configured such that the distance between the top surface of the substrate 900 and the bottom surface of the shadow ring is reduced during the activity 855 relative to the distance during activity 853.

The apparatus and methods described herein enable the distance between the substrate and a shadow ring to be changed between different process operations. As described herein, it is beneficial to have a reduced distance between the substrate and the shadow ring during a deposition operation, but the close proximity of the shadow ring to the substrate causes non-uniform treatment during later process activities. The treatment may include both the nucleation operation and the differential inhibition operation or just the differential inhibition operation. In embodiments described herein, the proximity of the shadow ring to the substrate is changed between the deposition operations and the treatment operations to increase the spacing between the shadow ring and the substrate during the treatment/differential inhibition operations. In processes in which the treatment includes both the nucleation operation and the differential inhibition operation, the shadow ring may be in a raised position during both operations. In processes in which the treatment includes only the differential inhibition operation, the shadow ring may be in a lowered position during the nucleation operation, a raised position during the differential inhibition operation, and in a lowered position during the deposition operations. Embodiments described herein have been shown to improve the treatment results while reducing film deposition on the beveled edge of the substrate.

While the foregoing is directed to embodiments of the present disclosure, other and further embodiments of the disclosure may be devised without departing from the basic scope thereof, and the scope thereof is determined by the claims that follow.

What is claimed is:

1. A process chamber for substrate processing, comprising:
   a chamber body;
   a substrate support assembly disposed within the chamber body, the substrate support assembly comprising:
      a substrate support;
      a purge ring defining a radially outward edge of the substrate support;
      a plurality of substrate lift pins disposed through the substrate support and radially inward of the purge ring; and
      a shadow ring lift assembly, the shadow ring lift assembly configured to raise and lower a shadow ring positioned around the radially outward edge of the substrate support, the shadow ring lift assembly comprising:
         a plurality of lift pin housings, wherein each lift pin housing is disposed around a substrate lift pin of the plurality of substrate lift pins;
         a shadow ring lift arm extending radially outward of the plurality of lift pin housings;

a lift hoop configured to support the plurality of substrate lift pins; and a plurality of shadow ring lift pins disposed radially outward of the substrate support, the plurality of substrate lift pins, and the lift hoop.

2. The process chamber of claim 1, wherein the shadow ring lift assembly is further configured to raise and lower the plurality of substrate lift pins.

3. The process chamber of claim 2, wherein;
the plurality of lift pin housings is configured to enable the plurality of substrate lift pins to be raised and lowered therein,
the plurality of shadow ring lift pins is configured to contact a bottom surface of the shadow ring, and
the lift hoop is configured to support each of the lift pin housings.

4. The process chamber of claim 3, further comprising a controller configured to cause the lift hoop to change a positions of both the plurality of substrate lift pins and the plurality of shadow ring lift pins.

5. The process chamber of claim 3, wherein each of the plurality of substrate lift pins includes a lift pin base configured to be disposed within one of the lift pin housings.

6. The process chamber of claim 1, further comprising a showerhead disposed over the substrate support.

7. The process chamber of claim 6, further comprising one or more gas sources and one or more radical generators, the one or more gas sources and the one or more radical generators configured to supply one or more deposition gases or one or more plasmas to a processing volume of the chamber body through the showerhead.

8. The process chamber of claim 1, wherein a lift pin actuator is coupled to the shadow ring lift assembly and is configured to vertically actuate the shadow ring lift assembly.

9. A process chamber for substrate processing, comprising:
a chamber body comprising a lower wall;
a substrate support assembly disposed within the chamber body, the substrate support assembly comprising:
a substrate support;
a purge ring defining a radially outward edge of the substrate support;
a plurality of substrate lift pins disposed through the substrate support and radially inward of the purge ring; and
a shadow ring lift assembly, the shadow ring lift assembly configured to raise and lower a shadow ring positioned around the purge ring of the substrate support, the shadow ring lift assembly comprising:
a lift hoop configured to support the plurality of substrate lift pins;
a shadow ring lift arm disposed away from the lower wall, while in a raised position;
a plurality of lift pin housings coupled to the plurality of substrate lift pins;
a shadow ring lift plate coupled to the plurality of lift pin housings; and
a plurality of shadow ring lift pins disposed radially outward of the substrate support, the plurality of substrate lift pins, and the lift hoop.

10. The process chamber of claim 9, wherein the shadow ring lift arm is disposed above the lower wall in a treatment position and disposed in contact with the lower wall while in a deposition position.

11. The process chamber of claim 10,
wherein the lower wall causes the shadow ring lift plate to disengage the plurality of substrate lift pins disposed in the plurality of lift pin housings from the lift hoop when the shadow ring lift arm contacts the lower wall.

12. The process chamber of claim 9, wherein the chamber body further comprises an opening, the substrate support disposed between the opening and the lower wall when in a transfer position and the opening disposed between the substrate support and the lower wall when the substrate support is in a processing position.

13. The process chamber of claim 9, wherein each lift pin housing of the plurality of lift pin housings is disposed around a lift pin base of each of the plurality of substrate lift pins, wherein the lift pin housings enable the lift hoop to be disposed away from the plurality of substrate lift pins while in a treatment position.

14. The process chamber of claim 13, wherein the shadow ring lift plate
extends outwardly from the plurality of lift pin housings.

15. A process chamber for substrate processing, comprising:
a chamber body comprising a lower wall;
a substrate support assembly disposed within the chamber body, the substrate support assembly comprising:
a substrate support;
a purge ring defining a radially outward edge of the substrate support; and
a shadow ring lift assembly configured to raise and lower a shadow ring positioned around the purge ring of the substrate support, the shadow ring lift assembly comprising:
a shadow ring lift plate;
a plurality of lift pin housings disposed through the shadow ring lift plate opposite the substrate support;
a plurality of substrate lift pins disposed in the plurality of lift pin housings, through the substrate support, and radially inward of the purge ring;
a lift hoop coupled to the plurality of lift pin housings configured to support the plurality of substrate lift pins;
a shadow ring lift arm extending radially outward of the plurality of lift pin housings; and
a plurality of shadow ring lift pins disposed on a radially outward region of the shadow ring lift arm.

16. The process chamber of claim 15, wherein the lower wall is disposed radially outward of the substrate support and configured to contact the shadow ring lift arm.

17. The process chamber of claim 15, wherein a top of the plurality of substrate lift pins is below a substrate support surface and the lift hoop is disposed away from the plurality of substrate lift pins when the substrate support is in a treatment position.

18. The process chamber of claim 17, wherein the substrate support is disposed about 25 mm away or less from a shower head when in the treatment position.

19. The process chamber of claim 17, wherein the substrate lift pins are free-hanging from the substrate support in the treatment position and the shadow ring moves independently of the substrate lift pins as the substrate support translates between a deposition position and the treatment position.

* * * * *